United States Patent
Ehsan et al.

(10) Patent No.: US 11,702,756 B2
(45) Date of Patent: Jul. 18, 2023

(54) COBALT OXIDE FILM UPON ELECTRON SINK

(71) Applicant: King Fahd University of Petroleum and Minerals, Dhahran (SA)

(72) Inventors: Muhammad Ali Ehsan, Dhahran (SA); Md. Abdul Aziz, Dhahran (SA); Abbas Saeed Hakeem, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 255 days.

(21) Appl. No.: 16/285,370

(22) Filed: Feb. 26, 2019

(65) Prior Publication Data
US 2020/0270757 A1    Aug. 27, 2020

(51) Int. Cl.
C23C 16/40     (2006.01)
C25B 11/091    (2021.01)
(Continued)

(52) U.S. Cl.
CPC ............. *C25B 11/091* (2021.01); *B01J 23/75* (2013.01); *B01J 35/0033* (2013.01);
(Continued)

(58) Field of Classification Search
None
See application file for complete search history.

(56) References Cited

U.S. PATENT DOCUMENTS

| 4,166,775 A | * | 9/1979 | Bruckenstein ..... G01N 27/4045 502/5 |
| 5,112,388 A | * | 5/1992 | Schulz .................. C25B 11/091 419/33 |

(Continued)

FOREIGN PATENT DOCUMENTS

| JP | 5409004 B2 | 2/2014 |
| WO | 2017/182923 A1 | 10/2017 |

OTHER PUBLICATIONS

Yeo (J. Am. Chem. Soc. 2011, 133, 5587-5593) (Year: 2011).*
(Continued)

*Primary Examiner* — Joel G Horning
(74) *Attorney, Agent, or Firm* — Oblon, McClelland, Maier & Neustadt, L.L.P.

(57) ABSTRACT

A synthetic methodology for robust, nanostructured films of cobalt oxide over metal evaporated gold or similar material layer of, e.g., 50 nm, directly onto glass or other substrates via aerosol assisted chemical vapor deposition (AACVD). This approach allows film growth rates in the range of, e.g., 0.8 nm/s, using a commercially available precursor, which is ~10-fold the rate of electrochemical synthetic routes. Thus, 250 nm thick cobalt oxide films may be generated in only 5 minutes of deposition time. The water oxidation reaction for such films may start at ~0.6 V vs Ag/AgCl with current density of 10 mA/cm$^2$ and is achieved at ~0.75 V corresponding to an overpotential of 484 mV. This current density is further increased to 60 mA/cm$^2$ at ~1.5 V (vs Ag/AgCl). Electrochemically active surface area (ECSA) calculations indicate that the synergy between a Au-film, acting as electron sink, and the cobalt oxide film(s), acting as catalytic layer(s), are more pronounced than the surface area effects.

14 Claims, 14 Drawing Sheets

(51) Int. Cl.

| | | |
|---|---|---|
| *C25B 1/04* | (2021.01) | |
| *B01J 23/75* | (2006.01) | |
| *B01J 37/02* | (2006.01) | |
| *B01J 35/00* | (2006.01) | |
| *C25B 11/051* | (2021.01) | |
| *C25B 11/057* | (2021.01) | |
| *C23C 16/448* | (2006.01) | |

(52) U.S. Cl.
CPC ............. *B01J 37/0244* (2013.01); *C25B 1/04* (2013.01); *C25B 11/051* (2021.01); *C25B 11/057* (2021.01); *C23C 16/405* (2013.01); *C23C 16/4486* (2013.01)

(56) References Cited

U.S. PATENT DOCUMENTS

| | | |
|---|---|---|
| 9,698,427 B2 | 7/2017 | Ying et al. |
| 2018/0087164 A1 | 3/2018 | Finke et al. |
| 2019/0119114 A1* | 4/2019 | Shibuya ............... B01J 37/0244 |

OTHER PUBLICATIONS

Kouotou (RSC Advances, 2012, 2, 10809-10812) (Year: 2012).*

Electronic Supplementary Information for Kouotou (RSC Advances, 2012, 2, 10809-10812) (Year: 2012).*

Zhang, et al. ; Electrochemical Biosensor Based on Nanoporous Au/CoO Core—Shell Material with Synergistic Catalysis. ; Chemphyschem 17(1) ; pp. 98-104 ; Jan. 4, 2016 ; Abstract Only ; 1 Page.

Sadiek, et al. ; Electrocatalytic Evolution of Oxygen Gas at Cobalt Oxide Nanoparticles Modified Electrodes ; International Journal of Electrochemical Science 7 ; pp. 3350-3361 ; Apr. 1, 2012 ; 12 Pages.

Lu, et al. ; Gold Nanoparticles Embedded within Mesoporous Cobalt Oxide Enhance Electrochemical Oxygen Evolution ; ChemSusChem vol. 7, Issue 1 ; Dec. 11, 2013 ; Abstract Only ; 2 Pages.

Naeem, et al. ; Fabrication of pristine Mn O and Ag—Mn O composite thin films by AACVD for photoelectrochemical water splitting ; Dalton Transactions, Issue 38 ; 2016 ; Abstract Only ; 4 Pages.

Yeo, et al. ; Enhanced Activity of Gold-Supported Cobalt Oxide for the Electrochemical Evolution of Oxygen ; Journal of the American Chemical Society 133 ; pp. 5587-5593 ; 2011 ; 7 Pages.

Zhang, et al. ; Engineering Cobalt Defects in Cobalt Oxide for Highly Efficient Electrocatalytic Oxygen Evolution ; ACS Catalyasis 8 ; pp. 3803-3811 ; 2018 ; 9 Pages.

Gerken, et al. ; Electrochemical Water Oxidation with Cobalt-Based Electrocatalysts from pH 0_14: The Thermodynamic Basis for Catalyst Structure, Stability, and Activity ; Journal of the American Chemical Society 133; pp. 14431-14442 ; 2011 ; 12 Pages.

* cited by examiner

COBALT OXIDE FILM UPON ELECTRON SINK

BACKGROUND OF THE INVENTION

Field of the Invention

The present disclosure relates to catalytic thin films and methods for making such robust, nanostructured films, particularly of cobalt oxide over metal evaporated gold layer(s), directly onto substrates such as plain glass, preferably via aerosol assisted chemical vapor deposition (AACVD). The present disclosure further relates to catalysts, particularly electrodes at least partially coated with such films, and methods of catalyzing an oxygen evolution reaction using such catalysts, e.g., electrodes.

Description of the Related Art

Nature can harvest energy from the sun via the oxygen evolution reaction (OER) in photosynthesis, which is a vital process for our planet, producing substantial amounts of oxygen in the atmosphere and converting carbon dioxide into carbohydrates. OER can also be artificially driven by photoelectrochemical or electrochemical means, wherein water is split in a four-electron transfer process either generating hydrogen and oxygen directly or transferring the electrons to carbon dioxide forming liquid fuels. Artificial OER has the potential to provide clean hydrogen energy and a sustainable clean environment. However, the viability of OER for larger scale applications is limited by inefficiencies, including an overpotential above the thermodynamically required value of 1.23 V at pH 0, due to the slower kinetics of OER, as well as the cost of the available catalysts.

Different metal oxides and their composites have been tested as catalysts for improving the efficiency and kinetics of OER in an effort to lower the overpotential and increase the current density. In this regard, cobalt based materials have been explored as replacements for $RuO_2$ and $IrO_2$, which have been traditionally thought to be the ideal candidates to catalyze the OER in acidic and basic media. Ru and Ir are two of the rarest metals on the planet, limiting their practical large scale use based on cost and sustainability grounds. Catalysts having at least moderate efficiency, longer stability against chemical and/or electrochemical corrosion, low cost, facile fabrication, and preferably high abundance on earth have thus been sought.

Among the metal catalysts potentially useful for water oxidation in OER, such as $Mn_2O_3$, $BiVO_4$, hydroxides of Ni—Fe, and Co based materials, cobalt oxides including $Co_3O_4$ and cobaltites ($M_xCo_{3-x}O_4$) substituted with Ni, Fe, or Cu have shown promising efficiency in OER. This is usually attributed to the structural and compositional changes in cobalt based anodes that occur over an applied voltage that influence the rate of OER. For instance, $Co_3O_4$ has been shown to have a spinel structure, consisting of Co(II) and Co(III) at the tetrahedral and octahedral sites, respectively. Under an electrochemical potential, the metallic surface of Co undergoes different phases of progressive oxidation thereby forming cobalt hydroxide, CoO, $Co_3O_4$, and then a CoOOH phase. Further increases in applied potential can lead to an anodic peak just before the onset of OER, which is attributed to the Co(III)/Co(IV) redox couple. Electron paramagnetic resonance (EPR) spectroscopy studies in molecular Co—P catalyst, DFT calculations, and recent experimental works involving gold supported cobalt oxide catalysts also indicate that cobaltites may be useful catalysts for OER. EPR shows that the population of Co(IV) centers increases from 3 to 7% when the overpotential is 526 mV. DFT calculations indicate that oxygen binding with a Co monolayer deposited on gold is much stronger than to the Co monolayer alone.

Co deposited on gold is easier to oxidize due to chemisorbed oxygen, a precursor to cobalt oxide, and electronegative gold atoms acting as an electron sink. Hollow spheres of $Co_3O_4$, using gold nanoparticles as cores, have demonstrated twice the water oxidation activity of equivalent solid $Co_3O_4$ particles of the same size. Another investigation of the activity of cobalt oxide deposited on a variety of metal surfaces, such as Au, Pt, Pd, Cu, and Co, in comparison to the activity of the bulk metals (Au, Cu, Co, Ir, Pd, Pt, etc.), has shown that the activity of cobalt oxide deposited on an electrochemically roughened gold surface is three-fold higher than that of bulk Ir and 40-fold higher than that of cobalt oxide alone. However, the use of bulk gold electrodes makes such methods costly. Moreover, electrochemical depositions require precise control and monitoring of experimental conditions, making such processes tedious.

Besides Co, metal oxides of Mn, Ni, and Ir with higher metal oxidation states may be more active in catalyzing OER. Studies have shown that increasing the population of metal reaction centers, such as Co, over the oxide surface may be beneficial for catalytic efficiency. Metal reaction centers may be increased by depositing cobalt oxide thin films on top of a highly electronegative support as an electron sink, such as an ultrathin gold layer.

Deposition of cobalt oxides has been conducted by molecular beam epitaxy, electrochemical deposition including thermal oxidation, sputtering and spray pyrolysis, plasma engraving, and a variety of chemical vapor deposition methods. Many of these methods, however, are either costly or lead to uncontrolled growth due to directional deposition mode.

Chemical vapor deposition and aerosol assisted chemical vapor deposition (AACVD) have been used to provide controlled growth and cost effective deposition of Co-containing films. Numerous cobalt precursors have been used for the chemical vapor depositions of $Co_xO_y$, which include [Co(acac)$_2$], [Co(acac)$_3$], [Co(hfac)$_2$], [Co(thd)$_2$], and [CpCo(CO)$_2$] where acac is acetyl acetonate, hfac is hexafluoroacetylyacetonate, thd is tetramethylheptanedionate, and Cp is cyclopentadienyl. The CVD process is limited by the lack of precursors having good stability in air and the ubiquity of moisture in the atmosphere. Available precursors require multistep syntheses and must have high vapor pressures. AACVD, on the other hand, can utilize non-volatile and/or thermally unstable precursors with the only requirement of solubility. For commercially available precursors, AACVD may be simple and viable.

A number of relevant efforts at uncovering improved methods and materials for OER have been undertaken.

US 2018/0087164 A1 by Finke et al. (Finke) discloses thin films that can be used to tune the catalytic characteristics of heterogeneous electrocatalysts. Finke tunes catalytic characteristics of heterogeneous electrocatalysts based upon the composition and/or thickness of the applied film, particularly tuning the performance of the chlorine evolution reaction (CER) and oxygen evolution reaction (OER) catalysts, $IrO_2$, $RuO_2$, and fluorine-doped tin oxide (FTO), by depositing thin films of $TiO_2$ using atomic layer deposition (ALD) and may use metal oxide films. While Finke discloses that conducting metals include but are not limited to, Ag, Cu, Au, Al, Mo, Zn, Li, W, brass, Ni, Fe, Pd, Pt, and Sn, Finke exemplifies only combinations of $TiO_2$ and $IrO_2$ and/or $RuO_2$. Finke uses an ALD for deposition, i.e., a process in which each reactant reacts with the surface in a self-limited way, and the reactant molecules can react only with a finite number of reactive sites on the surface, wherein, once all those sites have been consumed in the reactor, the growth stops. Finke does not disclose AACVD, nor specifically a cobalt oxide layer deposited on gold layer coated glass and using an aerosol of a cobalt-containing solution, such as cobalt(III) acetylacetonate in an alcohol.

WO 2017/182923 A1 by Li et al. (Li) discloses oxygen evolution reaction (OER) catalysts and uses thereof. Li's OER catalyst can include a carbon support, a discontinuous catalytic cobalt (II,III) oxide ($Co_3O_4$) nanolayer in direct contact with the carbon support, and an amorphous continuous carbon layer. Li's $Co_3O_4$ nanolayer is positioned between the carbon support and an amorphous continuous carbon layer, i.e., it does not directly contact a conducting layer comprising, e.g., gold. Li also describes only standard deposition methods, such as electrochemical, atomic layer, and chemical vapor deposition. Li uses neither a glass substrate, nor an aerosol of a cobalt solution, e.g., cobalt(III) acetylacetonate in an alcohol.

U.S. Pat. No. 9,698,427 to Ying et al. (Ying) discloses a particle exhibiting catalytic activity comprising (a) an inner core formed of an alloy material; and (b) an outer shell formed of a metal material surrounding the inner core, wherein the alloy material is selected such that the inner core exerts a compressive strain on the outer shell. Ying's catalyst is used for the oxygen reduction reaction (ORR) and preferably has a platinum outer shell and an Au or AuCu core, and has a core-shell structure. While Ying's outer shell may be of Pt, Pd, Ru, Rh, Ir, and/or Os, and the inner core may be of Au, Ag, Cu, Ni, Zn, Co, Fe, Pt, Pd, Ru, Rh, Ir, and/or Os, Ying does not disclose AACVD, nor an aerosol of a cobalt-containing solution, e.g., cobalt(III) acetylacetonate in an alcohol, nor an arrangement with Co on Au.

U.S. Pat. No. 7,704,919 to Adzic et al. (Adzic), discloses gold-coated particles useful as fuel cell electrocatalysts. Adzic's particles are composed of an electrocatalytically active core at least partially encapsulated by an outer shell of gold or gold alloy. Adzic prefers particles having a noble metal-containing core, and more particularly, a platinum or platinum alloy core. Adzic relates to fuel cells containing its electrocatalysts and methods for generating electrical energy. Adzic may use a gold outer shell and core including two or more metals of noble character, e.g., Pt, Pd, Au, Re, Rh, Ir, Ru, and/or Os, as well as Ni, Co, Fe, and/or Cu, even showing a gold-cobalt alloy for its core, but Adzic does not mention a gold-supported thin film of cobalt oxide, particularly not on glass, nor AACVD.

Chem. Phys. Chem. 2016, 17, 98-104 by C. Zhang et al. (C. Zhang) discloses an ultrathin CoO layer deposited on surfaces of nanoporous gold (NPG) films using atomic layer deposition (ALD), creating a flexible electrode. C. Zhang reports superior performance of the flexible NPG/CoO hybrids for electrochemical catalysis. C. Zhang's NPG/CoO hybrid not only achieves high catalytic activity for glucose oxidation and $H_2O_2$ reduction, but also exhibits a linear dependence of the electrical signal on the concentration of glucose and $H_2O_2$ molecules in the electrolyte. C. Zhang's sensitivity for $H_2O_2$ reduction can be as high as 62.5 $\mu A/(mm \cdot cm^2)$ with a linear dependence on concentration in the range of 0.1 to 92.9 mm. C. Zhang speculates a synergistic effect of Au and CoO interfaces, and the high conductivity of the gold skeleton with a large surface area. C. Zhang proposes potential applications in various transitional-metal-oxide-based electrochemical electrodes. C. Zhang does not disclose AACVD, nor such a process using an aerosol of a cobalt-containing solution, e.g., cobalt(III) acetylacetonate in an alcohol.

Int. J. Electrochem. Sci. 2012, 7, 3350-3361 by Sadiek et al. (Sadiek) discloses the electrocatalysis of an oxygen evolution reaction (OER) at cobalt oxide nanoparticles (nano-$CoO_x$) on modified glassy carbon, Au, or Pt electrodes using cyclic voltammetry. Sadiek's OER is reportedly enhanced upon modification of the electrodes with nano-$CoO_x$, as demonstrated by a negative shift in the polarization curves at the nano-$CoO_x$ modified electrodes compared to that obtained at the unmodified ones. Sadiek's nanometer-size CoO, have an average particle size of 200 nm, as determined by SEM. Sadiek reports that the electrocatalytic activity of the nano-$CoO_x$-modified electrodes towards OER is pH and loading level dependent, while substrate independent. Sadiek considers its catalysts candidates for industrial water electrolysis, but fails to disclose AACVD.

Chem Sus. Chem. 2014, 7(1), 82-86 by Lu et al. (Lu) discloses gold nanoparticles incorporated in mesoporous cobalt oxides (Au/$mCo_3O_4$) fabricated by nanocasting, using porous silica as the hard template. Lu reports that Au/$mCo_3O_4$ material exhibits enhanced catalytic activity towards water oxidation compared to bulk $mCo_3O_4$ in both alkaline and neutral solutions, ascribing the activity to a synergistic effect of electronegative metal gold, facilitating the generation of active $Co^{IV}$ sites, as well as the large specific surface area and the preferential exposure of catalytic active crystalline lattice. However, Lu neither suggests AACVD nor producing oxygen with its catalyst.

Dalton Trans. 2016, 45, 14928 by Naeem et al. (Naeem) discloses pristine $Mn_2O_3$ and Ag—$Mn_2O_3$ composite thin films developed on fluorine doped tin oxide (FTO) coated glass substrates at 450° C. by aerosol assisted chemical vapor deposition (AACVD) using a methanol solution of a 1:2 mixture of acetatoargentate(I), Ag($CH_3COO$), and [Mn(N,N-dimethylaminoethanolate)$_2$(trifluoroacetate)$_4$].
Energy dispersive X-ray (EDX) and X-ray photoelectron spectroscopy (XPS) analyses revealed a Ag to Mn ratio of 1:2 and confirmed the uniform dispersion of Ag nanoparticles into the $Mn_2O_3$ structure. Naeem's Ag—$Mn_2O_3$ film showed enhanced photocatalytic activity in photoelectrochemical (PEC) water splitting and yielded a photocurrent of 3 mA/$cm^2$ at 0.7 V versus Ag/AgCl which was 1.6 times higher than a pristine $Mn_2O_3$ film alone, under AM 1.5 G illumination (100 mW/$cm^2$). Naeem reports that a plasmonic effect of Ag nanoparticles enhances the visible light absorption, efficient electron-hole separation, and high carrier mobility of the Ag—$Mn_2O_3$ photoelectrode. Naeem does not, however, disclose cobalt-oxide films, nor gold films, and fails to disclose such a process using an aerosol of a cobalt-containing solution, e.g., cobalt(III) acetylacetonate in an alcohol, for AACVD.

J. Am. Chem. Soc. 2011, 133, 5587-5593 by Yoo et al. (Yoo) discloses electrochemical oxygen evolution reaction (OER) occurring on cobalt oxide films deposited on Au and other metal substrates, carried out in 0.1 M KOH. Yoo finds the turnover frequency for the OER by~0.4 ML of cobalt oxide deposited on Au to be 40 times higher than that of bulk cobalt oxide, and nearly three times higher than that for bulk Ir. Yoo reports that small amounts of cobalt oxide deposited on Pt, Pd, Cu, and Co decreased monotonically in the order Au>Pt>Pd>Cu>Co, paralleling the decreasing electronegativity of the substrate metal. Yoo's as-deposited cobalt oxide is present as $Co_3O_4$ but undergoes progressive oxidation to CoO(OH) with increasing anodic potential. Yoo attributes the higher OER activity of cobalt oxide deposited on Au to an increase in fraction of the Co sites present as Co(IV) cations, a state of cobalt believed to be essential for OER to occur, and hypothesizes how Co(IV) cations contribute to OER. However, Yoo deposits its cobalt oxide electrochemically, using anodic charges of 75, 170, 1900, 3000, 7500, and 15000 µC, and makes no mention of AACVD.

ACS Catal. 2018, 8, 3803-3811 by R. Zhang et al. (R. Zhang) describes fabricating cobalt-defected $Co_{3-x}O_4$ in situ for an oxygen evolution reaction (OER). R. Zhang's crystals have abundant Co vacancies and a distorted structure. DFT calculations indicate that the metal defects lead to obvious electronic delocalization, which enhances the carrier transport to participate in water-splitting reactions along the defective conducting channels and the water adsorption/activation on the catalyst surface. R. Zhang's cobalt-defected $Co_{3-x}O_4$ shows high OER activity by delivering a much lower overpotential of 268 mV at 10 mA/cm (with a Tafel slope of 38.2 mV/dec) for OER in KOH electrolyte, compared to normal $Co_3O_4$ (376 mV), $IrO_2$ (340 mV), and $RuO_2$ (276 mV). R. Zhang proposes making electronic delocalization structures in metal oxides for high-performance electrochemical catalysts. However, R. Zhang teaches neither AACVD, nor depositing onto gold.

J. Am. Chem. Soc. 2011, 133, 14431-14442 by Gerken et al. (Gerken) discloses cobalt-oxide electrocatalysts in fluoride-buffered electrolyte at pH 3.4 and a mechanistic investigation of cobalt-catalyzed water oxidation in aqueous buffering electrolytes from pH 0 to 14. Gerken describes interrelated mechanisms for electrochemical water oxidation in alkaline, neutral, and acidic media with electrodeposited Co-oxide catalyst films ($CoO_x^{cf}$s) as well as for a homogeneous Co-catalyzed electrochemical water oxidation reaction. The pH dependence of quasi-reversible features in cyclic voltammograms of Gerken's $CoO_x^{cf}$s provides the basis for a Pourbaix diagram that closely resembles a Pourbaix diagram derived from thermodynamic free energies of formation for a family of Co-based layered materials. Below pH 3, a shift from heterogeneous catalysis producing $O_2$ to homogeneous catalysis yielding $H_2O_2$ is observed. Gerken does not deposit its cobalt oxides on gold, nor does Gerken produce cobalt oxide by AACVD, but rather by electrochemical deposition.

In light of the above, a need remains for improved layered structures, particularly for catalysis, such as OER, and methods of making such structures.

SUMMARY OF THE INVENTION

Aspects of the invention provide methods of manufacturing multilayered catalyst structures. Inventive methods may comprise: coating an inert substrate with an electron sink material comprising a metal and/or metalloid having an electronegativity above 1.88, to obtain a coated substrate including an electron sink coating; heating the coated substrate at a temperature no greater than 600° C. in a reactor; and introducing an aerosol of a cobalt solution comprising a cobalt complex and a solvent with a carrier comprising an inert gas for a time, e.g., in a range of from 2 to 40 minutes to the reactor to form a cobalt oxide layer on the electron sink coating. Inventive methods and/or structures may implement any permutation of the features below or otherwise discussed herein as inventive.

The electron sink material may comprise at least 90 wt. %, relative to a total electron sink coating weight, of Se, Au, W, Pb, Rh, Pt, Os, Ir, Pd, Ru, As, Mo, Te, Sb, Tl, B, Bi, Ge, Hg, Sn, Ag, Ni, Re, Cu, and/or Si, or even at least 95 wt. %, relative to the total electron sink coating weight, of Au. The electron sink coating may have a thickness in the range of 30 to 70 nm.

The coating of the support with the electron sink material may be carried out using a metal evaporator coater. The heating of the coated substrate may be conducted at a temperature in a range of 450 to 500° C.

The cobalt solution may comprise cobalt(III) acetylacetonate, cobalt(II) acetylacetonate, cobalt(II) carbonate, cobalt (II) acetate, cobalt naphthenate, cobalt(II) phthalocyanine, cobalt(II) 2-ethylhexanoate, dicarbonyl-cyclopentadienyl cobalt(I), cobalt(II) oxalate, cobalt(II) oxo pivalate, cobalt (II) ethyl/butyl phosphonate, cobalt(II) nitrate, tris(ethylenediamine)cobalt(III) chloride, dichloro-bis(ethylenediamine) cobalt(III) halide, monocobalt edetate, bis(cyclopentadienyl) cobalt(II), protoporphyrin IX cobalt, dichloro-bis-(triphenylphosphine) cobalt(II), chloro-tris(triphenylphosphine) cobalt(I), and/or diiodo-bis(diphenylphosphino) ethane) cobalt(II). The cobalt complex may be a cobalt (III) complex, particularly cobalt (III) acetylacetonate.

The solvent for the cobalt solution comprises pyridine, N,N-dimethylformamide (DMF), N,N-dimethylacetamide, N-methyl pyrrolidone (NMP), hexamethylphosphoramide (HMPA), dimethyl sulfoxide (DMSO), acetonitrile, tetrahydrofuran (THF), 1,4-dioxane, dichloromethane, chloroform, carbon tetrachloride, dichloroethane, acetone, ethyl acetate, pet ether, pentane, hexane(s), decalin, THF, dioxane, benzene, toluene, xylene(s), o-dichlorobenzene, diethyl ether, methyl t-butyl ether, methanol, ethanol, ethylene glycol, isopropanol, propanol, and/or n-butanol, particularly an alcohol, such as methanol, ethanol, propanol, and/or isopropanol.

The cobalt complex and the solvent in the cobalt solution may be present in a weight ratio in a range of from 1:2 to 1:1000. The inert gas as the carrier may be $N_2$ and/or Ar. During the introducing of the aerosol, the carrier may flow at a rate in a range of from 0.1 to 10 mL/s. The cobalt oxide layer may form at a rate in a range of from 1 to 20 nm/s. The cobalt oxide layer may have a thickness in a range of from 100 to 1500 nm.

Inventive methods may further comprise, after the introducing: cooling the multilayered catalyst structure to a temperature between 10 and 45° C. under an inert gas over a period in a range of from 0.5 to 5 hours. The introducing the aerosol may take place for 3 to 7 minutes, with no further cobalt deposition.

Aspects of the invention include methods of conducting an oxygen evolution reaction, which methods may comprise: contacting an aqueous solution with an electrode comprising a glass layer, a gold layer, and an AACVD-deposited cobalt oxide layer, wherein the contacting generates $O_2$ from the aqueous solution, e.g., with an onset overpotential in a range of from 320 to 340 mV and/or with an overpotential at 10 $mA/cm^2$ in a range of from 460 to 500 mV.

Aspects of the invention include electrodes comprising: a glass layer; a gold layer having a thickness of 25 to 100 nm; and an AACVD-deposited cobalt oxide layer having a thickness in a range of from 100 to 1500 nm.

Aspects of the invention include electrodes manufactured by any permutation of the inventive methods disclosed herein.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
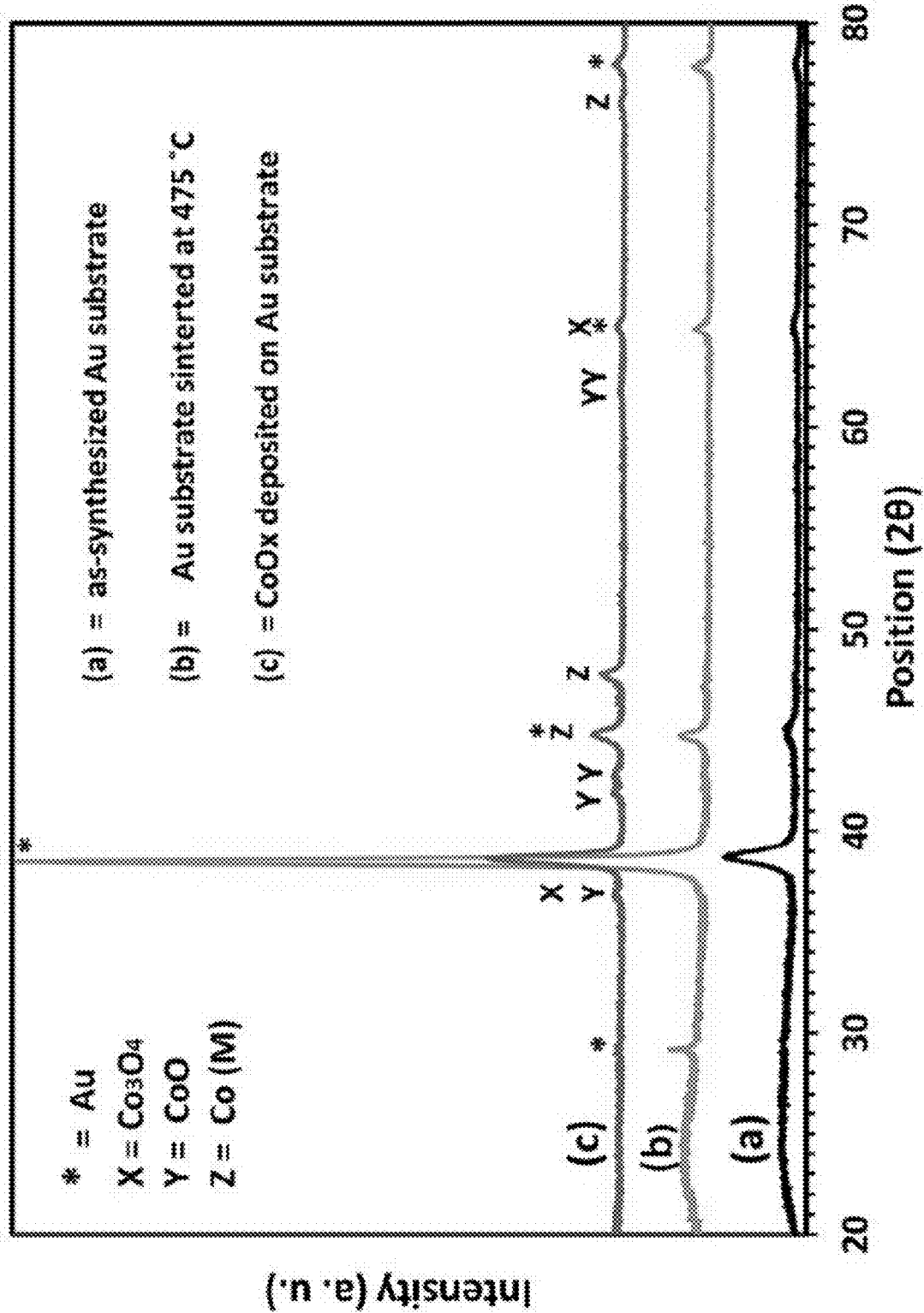
FIG. 1 shows x-ray diffraction (XRD) patterns of (a) an Au film on plain glass substrate as synthesized herein, (b) a sintered Au substrate at 475° C. for 20 min and (c) cobalt oxide deposited on Au substrate for 20 min at 475° C. via AACVD.

Aspects of the invention provide low cost, facile and rapid methods to produce gold supported films of cobalt oxide directly on a substrate such as glass using a modified AACVD technique. Commercially available precursors, such as $Co(acac)_3$, may be used for AACVD of cobalt oxide according to the inventive method. A uniform gold layer may first be developed on a substrate, such as glass, by metal evaporation. Thereafter, these modified gold electrodes may be employed as substrates in AACVD of cobalt oxide layers of varying thicknesses, by varying the deposition times, e.g., from 5 to 20 minutes. The electrochemical water splitting performance of these films compared to known materials has been found comparable to reported values, despite the rapid and efficient fabrication.

Glasses useful in the invention are generally limited only by the desired end use and may be made of (i) fused quartz (i.e., fused-silica or vitreous silica) glass, which may be stable at temperatures of at least 1000, 1100, 1200, 1250, 1300, 1350, or 1400° C., and/or up to 1750, 1700, 1650, 1600, 1550, or 1500° C., and/or having disordered and randomly arrange molecules, without crystalline structure; (ii) soda-lime-silica glass (i.e., soda-lime glass or window glass), made from 70 to 74, 71 to 73, or 71.5 to 72.5 wt. % silica (e.g., 73 to 74 wt. % silica), 13 to 14 wt. % $Na_2O$, 9 to 11 wt. % CaO, 0.005 to 0.025 wt. % titania, 0.2 to 0.4 or 0.03 to 0.04 wt. % $K_2O$, 1 to 2 or 0.1 to 0.2 wt. % alumina, 0.1 to 0.3 or 3 to 5 wt. % MgO, and/or 0.03 to 0.05 or 0.08 to 0.14 wt. % $Fe_2O_3$, optionally 0.1 to 0.3 wt.$ $SO_3$, and/or heat resistance of no more than 700, 650, 600, 550, or 500° C.; (iii) sodium borosilicate glass (i.e., Pyrex glass), having a coefficient of no more than 5, 4.5, 4, 3.5, 3.33, 3.25, or $3.125 \times 10^{-6}/°$ C., and/or having a $B_2O_3$ content in a range of from 7.5 to 17.5, 8 to 16.5, 9 to 16, 10 to 15, 11 to 14, or 12 to 13 wt. % and a $SiO_2$ content over 80, 82, 84, 85, 86, 87, or 88 wt. %; (iv) lead-oxide glass (i.e., crystal or lead glass), which, in addition to silica and other components, contains from 18 to 40, 20 to 36, 22 to 32, 24 to 30, or 25 to 28 wt. % PbO; (v) aluminosilicate glass, containing 14 to 30, 15 to 25, 17.5 to 22.25 wt. % $Al_2O_3$, 50 to 64, 52 to 60, 54 to 58 wt. % $SiO_2$, and/or 13 to 17, 14 to 16, or 15±0.1, 0.25, or 0.5 wt. % alkaline earths; and/or (vi) germanium-oxide glass, which, in addition to silica and other components, contains more than 40, 45, 50, or 55 wt. % GeO, and/or having a hardness in a range of from 0.3 to 3, 0.33 to 2.75, 0.35 to 2.5, or 0.39 to 2.35 GPa.

Aspects of the invention provide methods of manufacturing multilayered structures, particularly cobalt oxide on gold, particularly catalytic structures, e.g., towards the OER. Inventive methods may comprise: coating an inert substrate, i.e., unreactive to the coatings thereon and suitable to withstand the deposition temperature, with an electron sink material comprising a metal and/or metalloid having an electronegativity above 1.88, or at least 1.89, 1.90, 1.92, 1.95, 2.00, 2.05, 2.10, 2.15, 2.20, 2.25, 2.30, or 2.35, to obtain a coated substrate including an electron sink coating; heating the coated substrate at a temperature no greater than 600, 575, 550, 525, 500, 490, 480, or 475° C. in a reactor or other suitable contained vessel; and introducing—generally at the same temperature to which the coated substrate is heated—an aerosol of a cobalt solution comprising a cobalt complex and a solvent with a carrier comprising an inert gas for a time in a range of from 1 to 60, 2 to 40, 3 to 30, 3.5 to 20, 3.75 to 15, 4 to 10, or 4.5 to 7 minutes to the reactor to form a cobalt oxide layer on the electron sink coating. Useful substrate materials may include glass, quartz, optionally filled polymers for thermal stability, such as polybenzimidazoles (PBI, e.g., poly-2,2'-(m-phenylene)-5,5'-bibenzimidazole), polyaramides, polyarimides, polypyromellitimidines, poly(p-phenylene) (PPP), polyether sulfones (PES), polyether ether ketone (PEEK), polyether ketone (PEK), polyphenylsulfone (PPSF or PPSU), polysulfone (PSU), polyamide-imides (PAI), polyetherimide (PEI), polyphenylene sulfide (PPS), Baekelite, melamine, silicone plastics, etc., optionally carbon and/or glass filled, e.g., 10, 15, 20, 25, or 33 wt. %, ceramics, and the like. While the deposition temperature may generally be above 200° C., it will typically within any of the above temperature bounds and/or be no greater than 500, 495, 485, 475, 465, 450, 440, 425, or even 400° C.

The electron sink material may comprise at least 90, 91, 92, 92.5, 93, 94, 95, 96, 97, 97.5, 98, 99, 99.1, 99.5, or 99.9 wt. %, relative to a total electron sink coating weight, of Se, Au, W, Pb, Rh, Pt, Os, Ir, Pd, Ru, As, Mo, Te, Sb, Tl, B, Bi, Ge, Hg, Sn, Ag, Ni, Re, Cu, and/or Si, or particularly at least 97.5, 98, 99, 99.1, 99.5, 99.9, 99.99, or 99.999 wt. %, relative to the total electron sink coating weight, of Au. The electron sink may be entirely of one element, ignoring inevitable traces inherent to the production of these elements. While gold has desirable properties, including its high electronegativity and its conductivity, certain applications may call for a metalloid, such as Si, Se, Tl, B, or Te, or certain applications may be better served by a less expensive materials, such as Sn, Cu, Ni, Bi, As, Pb, and/or Mo. Tungsten could also be superior in some applications. Amalgams with mercury may be useful in some circumstances, particularly low-temperature end uses (e.g., under 0, −10, or −20° C.).

The electron sink coating may have a thickness in the range of, for example, 10 to 100, 30 to 70, 40 to 60, or 45 to 55 nm, and/or at least 10, 25, 35, 45, 47.5, 50, 52.5, 55, or 60 nm. In the case of expensive materials, the electron sink coating will generally be desirably smaller. As explained below, the reactivity of inventive structures is not thought to be dependent upon the thickness of the electron sink coating, but more upon the sufficient interface of the electron sink coating with the cobalt-oxide layer.

The coating of the support with the electron sink material may be carried out using a metal evaporator coater, or electroplating, or any other suitable means of creating a layer on the substrate. The coated substrate may be heated to a temperature in a range of, for example, 450 to 500, 460 to 490, 470 to 480, or 472.5 to 477.5° C., and/or at least 300, 350, 375, 400, 425, 435, 445, 455, or 465° C., and/or no more than 600, 575, 550, 525, 510, 505, 495, 485, 475, 465, 450, 425, 400, or 375° C. The cobalt solution may be vaporized/aerosolized with a sonication device, such as a piezoelectric ultrasonic humidifier, or an atomizing sprayer, or any other suitable gasification device.

The cobalt solution will generally comprise appropriately soluble and aerosolizable complexes of cobalt, suitable to convert into a cobalt-oxide coating as described herein, and may comprise cobalt(III) acetylacetonate, cobalt(II) acetylacetonate, cobalt(II) carbonate, cobalt(II) acetate, cobalt naphthenate, cobalt(II) phthalocyanine, cobalt(II) 2-ethylhexanoate, dicarbonyl-cyclopentadienyl cobalt(I), cobalt(II) oxalate, cobalt(II) oxo pivalate, cobalt(II) ethyl/butyl phosphonate, cobalt(II) nitrate, tris(ethylenediamine)cobalt(III) chloride, dichloro-bis(ethylenediamine) cobalt(III) halide, monocobalt edetate, bis(cyclopentadienyl) cobalt(II), protoporphyrin IX cobalt, dichloro-bis-(triphenylphosphine) cobalt(II), chloro-tris(triphenylphosphine) cobalt(I), and/or diiodo-bis(diphenylphosphino)ethane) cobalt(II). The cobalt complex may be a cobalt (III) complex, or may make out at least 75, 80, 85, 90, 91, 92, 92.5, 93, 94, 95, 96, 97, 97.5, 98, 99, 99.1, 99.5, or 99.9 wt. % of a total weight of the non-volatiles in the solution, or one or more cobalt (III) complexes, particularly cobalt (III) acetylacetonate.

The solvent for the cobalt solution comprises pyridine, N,N-dimethylformamide (DMF), N,N-dimethylacetamide, N-methyl pyrrolidone (NMP), hexamethylphosphoramide (HMPA), dimethyl sulfoxide (DMSO), acetonitrile, tetrahydrofuran (THF), 1,4-dioxane, dichloromethane, chloroform, carbon tetrachloride, dichloroethane, acetone, ethyl acetate, pet ether, pentane, hexane(s), decalin, THF, dioxane, benzene, toluene, xylene(s), o-dichlorobenzene, diethyl ether, methyl t-butyl ether, methanol, ethanol, ethylene glycol, isopropanol, propanol, and/or n-butanol, particularly an alcohol, such as methanol, ethanol, propanol, and/or isopropanol. While water may be used with certain cobalt complexes and certain reactors, electron sink coatings, and/or reactors, organic solvents are generally thought preferable, particularly ethers and alcohols and mixtures of these.

The cobalt complex and the solvent in the cobalt solution may be present in a weight ratio in a range of from 1:2 to 1:1000, 1:5 to 1:750, 1:10 to 1:600, 1:20 to 1:500, 1:33 to 1:400, 1:50 to 1:300, 1:60 to 1:250, 1:75 to 1:200, 1:80 to 1:150, or 1:85 to 1:125. The inert gas as the carrier may be $N_2$ and/or Ar, and may be a conventional industrial gas of varying degrees of purity based upon the end use. During the introducing of the aerosol, which will generally occur at the temperatures above for the heating of the coated substrate (i.e., also the deposition temperature, and generally not solely an annealing temperature, as discussed below), the carrier may flow at a rate in a range of from, for example, 0.1 to 10, 0.5 to 8, 1 to 6, 1.25 to 5, 1.5 to 4, 1.75 to 3, or 1.85 to 2 mL/s.

The cobalt oxide layer may form at a rate in a range of from, for example, 1 to 20, 2 to 17.5, 3 to 15, 4 to 12.5, 5 to 10, or 7.5 to 9 nm/s, and/or at least 1.5, 1.75, 2, 2.5, 3.33, 3.5, 4, 4.5, 5, 6.5, 7, 7.5, 7.75, 8, 8.25, 8.5, 8.75, 9, or 10 nm/s. The cobalt oxide layer may have a thickness in a range of from, for example, 100 to 1500, 200 to 1250, 250 to 1000, or 400 to 800 nm, and/or at least 150, 175, 225, 250, 275, 300, 350, 375, or 400 nm, while not necessarily being any more than any of these endpoints.

Inventive methods may further comprise, after the introducing: cooling the multilayered catalyst structure to a temperature between 10 and 45, 20 to 40, or 25 to 35° C. under an inert gas over a period in a range of from 0.5 to 5, 0.75 to 4, 1 to 3, 1.25 to 2.5, 1.5 to 2 hours. The introducing the aerosol may take place for 2 to 10, 3 to 7, 4 to 6, or 4.5 to 5.5 minutes, generally with no further cobalt deposition. However, additional cobalt oxide layers may be deposited as desired. Electrodes may be prepared by any permutation of these inventive methods disclosed herein, particularly in a manner that quickly, using less than 75, 50, or 25% the energy of CVD, and/or in ½, ⅓, ¼, or ⅒ the time of electroplating or electrochemical methods.

The pressure during the deposition is practically unlimited, but need not be an underpressure or overpressure, and can generally be in a range of from 200 to 1000, 350 to 900, 500 to 850, 600 to 800, 700 to 790, or 750 to 780 mm Hg, or at ambient pressure.

Relative to the catalyst layer, inventive may have no more than 25, 20, 15, 10, 5, 4, 3, 2, 1, 0.5, 0.1, 0.001, or 0.0001 wt. % or no more than trace detectable amounts of Pt, Pd, Ru, Rh, Ir, Ag, Cu, Ni, Zn, Co, Fe, Pt, Pd, Ru, Rh, Ir, Al, Mo, Li, W, brass, Fe, Sn, and/or Os. Inventive multilayer structures may advantageously contain no carbon layer, or none contacting the cobalt oxide layer. Alternately, aspects of the invention could present layers of cobalt oxide on diamond, particularly blue diamond, and/or upon graphite.

Inventive catalyst structures may have, based on either the weight of the entire structure or the metal oxide layer(s), no more than 25, 20, 15, 10, 5, 4, 3, 2, 1, 0.5, 0.1, 0.001, or 0.0001 wt. % or no more than trace detectable amounts of $Al_2O_3$, $NH_4OSbW$, $Sb_2O_5$, $BaO$, $BaTiO_3$, $BaZrO_3$, $Al_6BeO_{10}$, $BeO$, $Bi_2O_3$, $Bi_2O_5$, $B_2O_3$, $CdO$, $CaO$, $Ce_2O_3$, $CeO_2$, $CrO$, $Cr_2O_3$, $CrO_2$, $CrO_3$, $CoO$, $Co_2O_3$, $Cu_2O_5Yb_2$, $Cu_2O$, $CuFe_2O_4$, $CuO$, $GaO$, $Ga_2O_3$, $GeO$, $GeO_2$, $Au_2O$, $Au_2O_3$, $HfO_2$, $In_2O$, $InO$, $In_2O_3$, $Ir_2O_3$, $IrO_2$, $Fe_3O_4$, $FeO$, $Fe_2O_3$, $PbO$, $PbO_2$, $Li_2O$, $Al_2MgO_4$, $MgO$, $Mn_3O_4$, $MnO$, $Mn_2O_3$, $MnO_2$, $Mn_2O_5$, $Mn_2O_7$, $Hg_2O$, $HgO$, $MoO_2$, $MoO_3$, $Mo_2O_5$, $NiFe_2O_4$, $NiO$, $Ni_2O_3$, $LiNbO_3$, $NaNbO_3$, $Nb_2O_3$, $Nb_2O_5$, $Os_2O_3$, $OsO_3$, $OsO_4$, $PdO$, $PdO_2$, $(C_6H_5)AsO$, $Pt_3O_4$, $PtO$, $Pt_2O_3$, $K_2O$, $Re_2O_7$, $ReO_4$, $Rh_2O_3$, $Rb_2O$, $RuO_2$, $RuO_4$, $Sc_2O_3$, $Se_3O_4$, $Ag_2O$, $Na_2O$, $SrO$, $NaTaO_3$, $Ta_2O_3$, $Ta_2O_5$, $SiO_2$, $SnO$, $SnO_2$, $SrTiO_3$, $TiO$, $Ti_2O_3$, $TiO_2$, $WCl_2O_2$, $W_2O_3$, $WO_2$, $WO_3$, $W_2O_5$, $VOCl_2$, $VO$, $V_2O_3$, $VO_2$, $V_2O_5$, $Yb_2O_3$, $YBa_2Cu_3O_7$, $Y_2O_3$, $ZnO$, $ZrO_2$, fluorine-doped tin oxide, iron doped titanium oxide, $WO_3$-doped ZnO, Fe-doped $CeO_2$, tin-doped $Fe_3O_4$, and/or indium tin oxide (ITO).

Although mechanism(s) of electrochemical water splitting on Co-surfaces is not fully known, there is a general consensus that the surface of cobalt goes through successive oxidation reactions forming species of cobalt with different oxidation states from (II) to (IV), with Co(IV) being the most significant species and the formation of Co(IV) marking the onset of oxygen evolution. A number of theoretical and experimental observations suggest that by depositing cobalt oxide on gold or by combining these two metals can enhance the OER activity of the Co-based material. It is speculated that an increased feasibility of oxidation of different cobalt species is facilitated by underlying gold atoms.

Gold has this special capability because of its highest electronegativity of transition metals, making gold act as electron sink facilitating easier conversion of oxidation states from II to III and then to IV for cobalt species. This function may be applicable to metals or alloys with similar characteristics, such as Ag, Pt, Ir, Os, Re, W, Mo, Ru, Rh, Pd, Hg, Cd, Tl, Pb, Sn, and/or In. It is believed that the deposited cobalt film should to be linked to an electronegative element, such as gold, to support and/or maintain a higher concentration of Co (IV) species in the top layer. In the present application the electronegative element is provided in the form of pure evaporated gold that by itself is nanostructured to give a coherence to the resulting film electrodes. Beyond this, the whole deposition process using AACVD as disclosed herein is simple, low cost, and fast for batch production and utilization at industrial scale.

The synthesis of one or more nanostructured cobalt oxide films over a nanostructured gold film with high catalytic performance towards oxygen evolution reaction (OER) can thus be achieved using a simple, facile, and rapid method of AACVD and commercially available precursor(s). It is believed that the intrinsic material properties upon a gold (or similar metal or alloy) film has a more significant role in catalytic activity than the surface area factor. This means that the active sites should be closely linked to the electron sink in the form of gold. Mediated by the (e.g., gold) electron sink, the oxidation process of cobalt oxide is thought to be enhanced, thereby increasing the $Co^{+4}$ population in the films, which in turn is related to the enhanced catalytic activity. Using AACVD, a high deposition rate for the metal oxide film is achieved with higher number of active sites for the catalytic process. Even a 5-minute deposition can produce a dispersed monolayer of nanoparticles. The catalytic performance of such rapidly prepared film can be comparable to or even better than tediously prepared films of the art, e.g., in terms of current density, onset potential, and/or overpotential.

EXAMPLES

MATERIALS AND CHEMICALS: Plain glass slides (75 mm×1 mm) were purchased from Fisher Scientific, USA. Cobalt (III) acetylacotonate, i.e., $Co(acac)_3$, sodium hydroxide, NaOH, and methanol, MeOH, were all purchased from Sigma-Aldrich.

ELECTRODE FABRICATION: Plain glass strips were cut to an area of 1.0×2.0 $cm^2$ (W×L) and sequentially washed with soapy water, acetone, and ethanol in ultrasonic bath before the deposition process. Gold coatings were applied on these substrates using Metal evaporator coater Q150T E of Quorum technologies. A homogenous Au layer (50 nm) was obtained in 4 minutes at outgas current of 10 amperes and a tooling factor of 4.0. Once the thickness monitor showed 50 nm readings, the coating process was terminated and Au coated substrates were characterized by XRD and SEM. Further, cobalt oxide films were grown on these gold substrates using custom-built AACVD setup as reported in *Adv. Eng. Mater.* 2015, 18(6), 1059-1065, which is incorporated by reference in its entirety herein.

In a typical deposition experiment, $Co(acac)_3$ ($C_{15}H_{24}O_6Co$, 50 mg, 0.140 mmol) precursor was dissolved in MeOH (6 mL) to obtain a dark green solution used directly in AACVD for the growth of cobalt oxide thin films. For each of the deposition experiment, the gold substrate was laid horizontally inside the reactor tube, heated up to the deposition temperature of 475° C., equilibrated for 10 minutes therein, and then the deposition process was started. A piezoelectric ultrasonic humidifier was used to transport the precursor solutions into the reactor tube in the form of an aerosol mist, for which nitrogen ($N_2$) gas was used as the carrier gas at a rate of 120 $cm^3$/min. Waste exhaust of the precursor mist was vented into a fume hood. The deposition experiments were carried out for four different durations, i.e., 5, 10, 15 and 20 minutes, fixing the other deposition parameters, such as the gold substrate, deposition temperature, solution concentration, and the rate of carrier gas.

When the deposition was completed, the cobalt oxide coated substrates were cooled under a continuous flow of $N_2$ gas, until the temperature was below 40° C. The substrates were then removed from the reactor. The deposited films were black in color, reflective, uniform, robust and stable towards atmospheric conditions while adhering strongly to the gold substrate as verified by the "Scotch tape test."

FILM ELECTRODE CHARACTERIZATION: A Rigaku MiniFlex X-ray diffractometer (Japan) was used to explore the phase and crystallinity of the gold coatings and cobalt oxide films grown on gold substrates with Cu Kα1 radiation (γ=0.15416 nm), a tube current of 10 mA, and an accelerating voltage of 30 kV. Microstructure of the film electrodes was evaluated by a field emission scanning electron microscope (FE SEM, Lyra3, Tescan, Czech Republic) at an accelerating voltage of 20 kV. Energy dispersive x-ray spectroscopy (EDX or EDS, INCA Energy 200, Oxford Inst.) was employed to determine the composition of the electrodes. X-ray photoelectron spectroscopy (XPS) experiments were performed in a Thermos Scientific Escalab 250Xi spectrometer equipped with a monochromatic Al Kα (1486.6 eV) x-ray source, having a resolution of 0.5 eV. During the XPS characterization, the ambient conditions of temperature were maintained while the pressure is controlled at $5\times10^{-10}$ mbar. The spectra were referenced with the adventitious C 1s peak at 284.5 eV.

ELECTROCHEMICAL MEASUREMENTS: All electrochemical measurements were performed using a CHI (760E) electrochemical work station (CH Instruments, Inc. 3700 Tennison Hill Dr. Austin, Tex. 78738-5012 USA). Bare or cobalt oxide-modified Au thin film electrodes were used as working electrodes, Ag/AgCl was used as the reference electrode, and a platinum wire was used as the counter electrode. All electrochemical measurements were performed in aqueous solution of 0.1 M NaOH at room temperature.

SELECTION OF COBALT PRECURSOR FOR AACVD: CVD based techniques have been frequently used for the synthesis of cobalt oxide films. A range of commercially available and self-designed chemical precursors have been employed in these techniques to develop morphologically tuned cobalt oxide films with different phases. Cobalt oxide formation, either as CoO, $Co_3O_4$ or a mixture of the both, significantly depends upon the choice of deposition method and the processing parameters like temperature, precursor type, and substrate material. For example, *Appl. Surface Sci.* 2016, 360, 540-546 (incorporated by reference in its entirety herein) reports the formation of pure CoO film via conventional CVD using $Co_2(CO)_8$ precursor at temperatures between 120° C. and 190° C. without any additional oxygen source. *RSC Advances* 2017, 7(79), 50269-50278 (incorporated by reference in its entirety herein) uses dicobaltatetrahedrane precursor in CVD, whereby oxygen and/or water vapors were incorporated as possible co-reactants for the formation of pure CoO or $Co_3O_4$ and a mixture of both, by changing processing temperatures. *RSC Advances* 2012, 2(29), 10809-10812 (incorporated by reference in its entirety herein) reports that CVD using $Co(acac)_3$ precursor gave the $Co_3O_4$ product.

AACVD has not yet been investigated for depositing cobalt oxide films, nor has $Co(acac)_3$ been used in AACVD. This may be because resulting product of $Co(acac)_3$ lacks reaction centers for the onset of Co(III)/Co(IV) redox couple, thereby limiting the water oxidation reaction. However, the inventors have surprisingly found that if the same cobalt oxide film can be deposited directly onto an electron sink, in the form of gold film on glass or a bulk gold electrode, OER catalytic efficiency can be enhanced, as achieved via modified AACVD reported here.

SYNTHESIS AND CHARACTERIZATION OF COBALT OXIDE FILMS ON METAL EVAPORATED GOLD: A modified AACVD scheme was used to create a synergistic effect of gold as an electron sink and cobalt oxide as a catalyst for water oxidation. Gold substrates were first created by directly coating Au on glass by a facile metal evaporation method. The nanostructured gold film so obtained has high surface roughness and is ready for further deposition of cobalt oxide films without any need of electrochemical roughening of the metal electrodes as reported in *J. Am. Chem. Soc.* 2011, 133(14), 5587-5593 (incorporated by reference in its entirety herein). The expansion process is cleaner than an electrochemical roughening as there is no deposition of impurities from the solutions used for electrochemistry. For instance, if $Cl^-$ ions are deposited as impurity during the electrochemical roughening, these can be oxidized to $ClO_4^-$ ions during anodic scans of water oxidation process, thereby generating false positive current for OER.

Cobalt oxide films were then deposited directly on these nanostructured gold substrates to generate an interface between two nano-structured films, proving efficient for OER as characterized by several techniques.

Referring now to the drawings, wherein like reference numerals designate identical or corresponding parts throughout the several views.

FIG. 1 shows (a) the X-ray diffraction patterns of the Au film processed on plain glass via metal evaporation at room temperature; (b) an Au film sintered at 475° C. for 20 min under inert conditions; and (c) a cobalt oxide film deposited on gold substrate through AACVD for 20 min at the temperature of 475° C. Comparing these XRD patterns, it can be seen that all the diffractograms are dominated by the Au peak at 38.3°. The crystallinity of Au in FIG. 1B was improved by annealing the gold substrate at 475° C., which is the deposition temperature of cobalt oxide in the AACVD used herein. All the crystalline peaks of gold are indicated by the symbol (*) according to ICDD card number (03-065-8601). The crystallinity of cobalt oxide layer is lower relative to the gold reflections. The x-ray peaks at 2θ o 41.5°, 43.6°, 61.5°, 62.0°, and 77.9° correspond to (−111), (200), (−202), (−311) and (220) planes of the cubic cobalt oxide (II) CoO phase labelled as "Y" (ICDD=01-072-1474). The presence of cobalt metal is recognized by the crystalline peaks at 2θ of 45.0° (002), 48.0° (101), and 76.0° (110) and marked by "Z" (ICDD=01-077-7453). The peak at 2θ of 37° in the pattern could be attributed to both the (110) reflection of CoO and the (311) reflection of $Co_3O_4$. The XRD pattern also revealed the formation of small amount of $Co_3O_4$ by few crystalline peaks marked by "X" at 2θ=36.9° and 64.8° from planes (311) and (440).

Figure 2A:
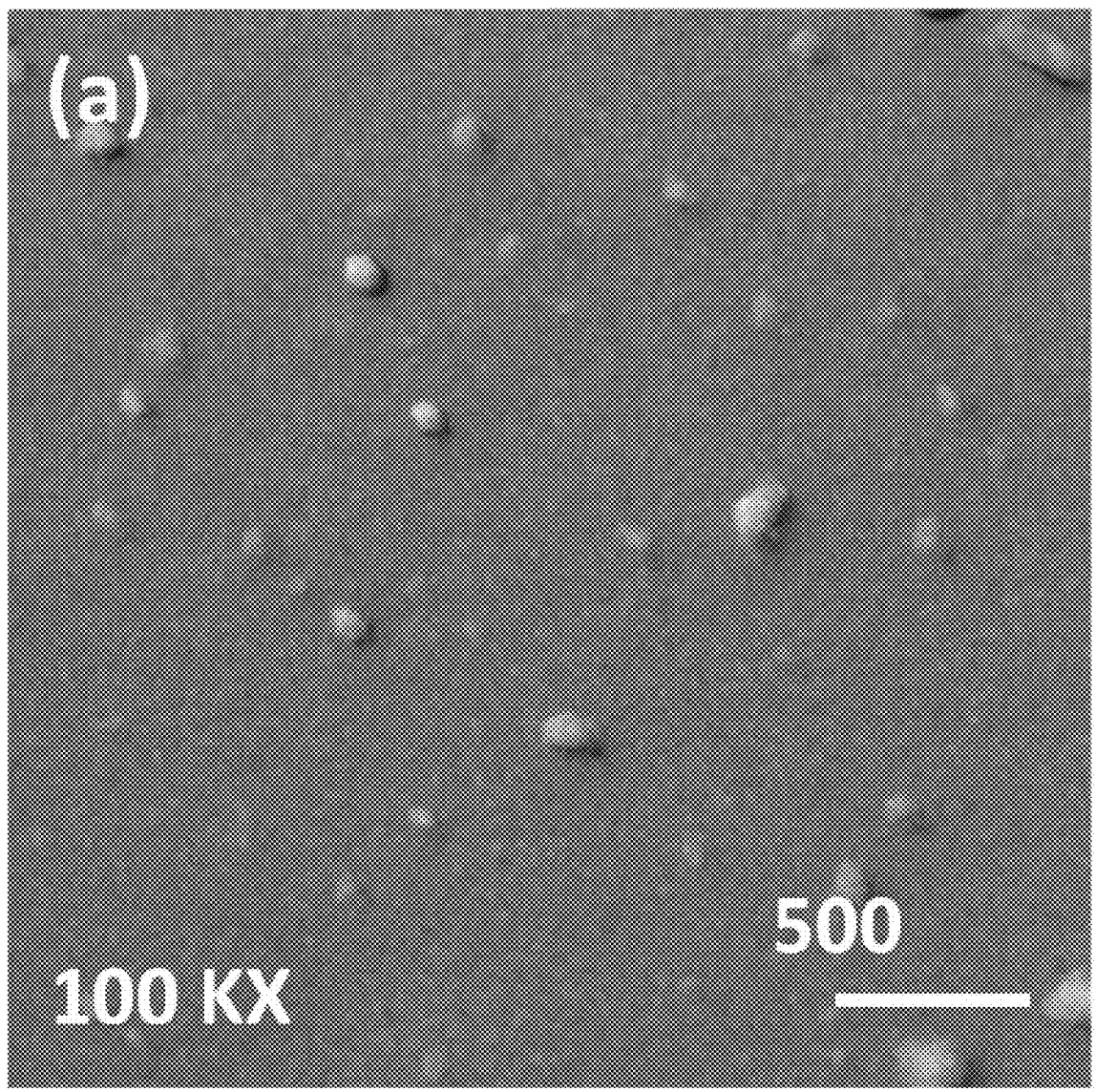
FIG. 2A shows a scanning electron microscopy (SEM) top plan image of an Au substrate as prepared herein.
Figure 2B:
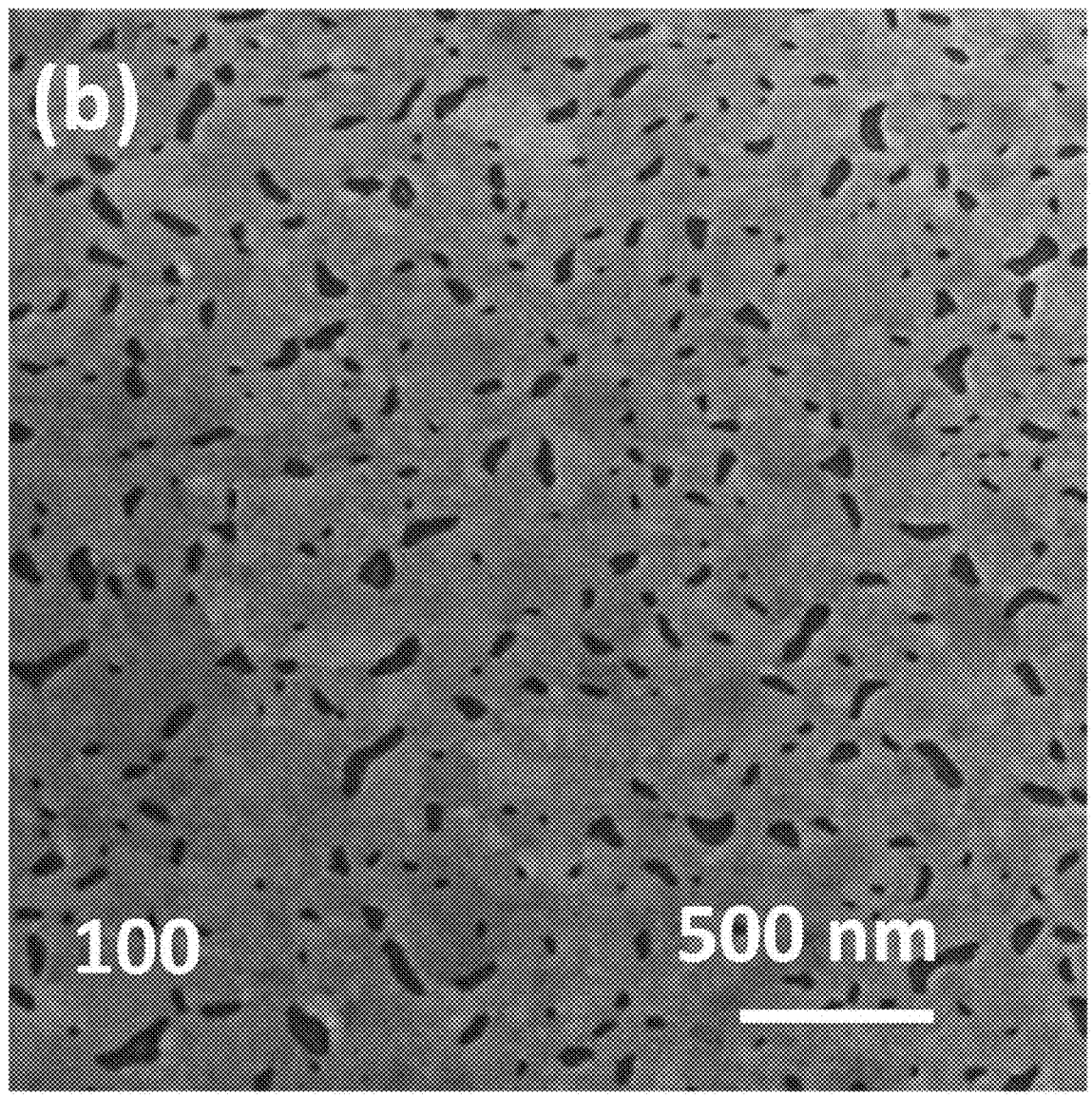
FIG. 2B show an SEM top plan image the Au substrate from FIG. 2A after sintering at 475° C.

FIGS. 2A and 2B show the surface SEM images of a gold substrate made according to the Example via metal evaporation (though other syntheses may be suitable, particularly those producing similar morphologies to those described herein) before and after thermal sintering at 475° C. FIG. 2A indicates that the gold layer produced through metal evaporation is homogenous with constant surface roughness and marks of nanosized spherical objects on its surface. The gold layer's thickness, measured from its cross sectional view is ~50 nm, though suitable thicknesses may be in a range of from 10 to 1000, 15 to 750, 20 to 500, 25 to 250, 30 to 150, 35 to 100, or 40 to 75 nm, depending upon the application, using any of these end points in any range. FIG. 2B shows the surface morphology of the gold substrate after sintering at 475° C. for 20 minutes under $N_2$ gas flow. After sintering, cracks and voids are produced on the Au surface, making its surface more roughened and compact. The detailed XRD and SEM analysis of the Au substrate, before and after sintering, was performed in order to determine the influence of sintering on the final OER efficiency of the Au films, e.g., by changing the crystallinity and/or morphology of the Au substrate, as discussed below.

FIG. 3A to 3D show the surface (plan view) and cross-sectional SEM images of cobalt oxide layers deposited on sintered Au substrates via AACVD. Four cobalt oxide electrodes: (a) CoOx-5, (b) CoOx-10, (c) CoOx-15, and (d)

Figure 3A:
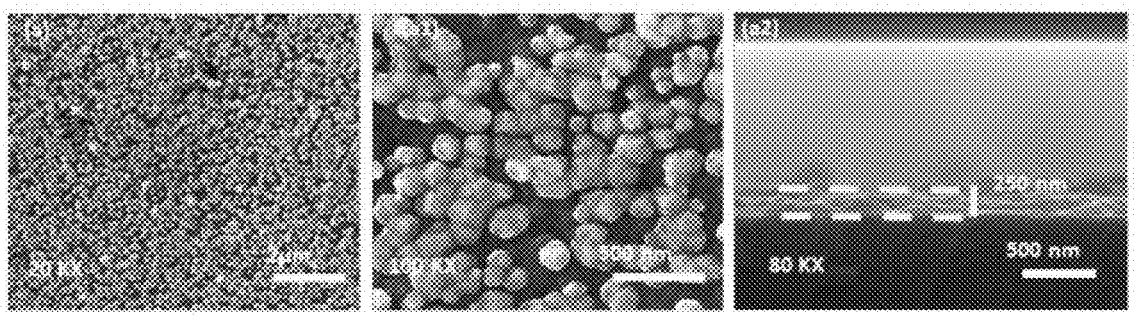
FIG. 3A shows SEM images of deposited cobalt oxide films on gold substrate at 475° C. via AACVD within the scope of the invention in a low resolution top plan view (left), a high resolution top plan view (middle), and a cross-sectional view (right) for a deposition time of 5 minutes.
Figure 3B:
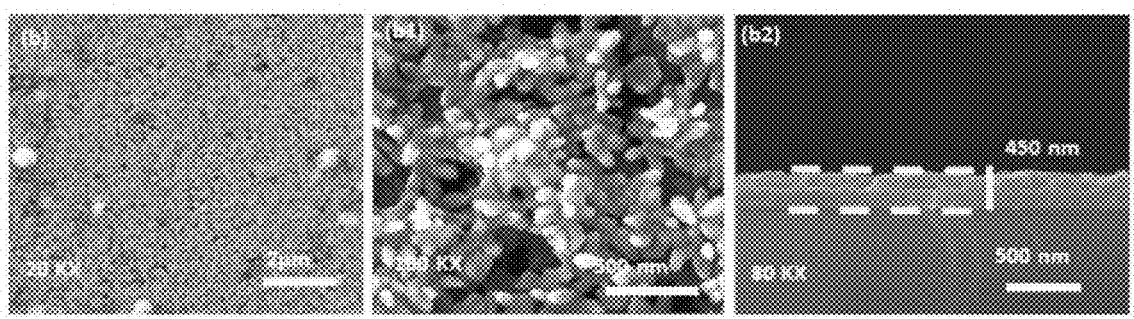
FIG. 3B shows SEM images of deposited cobalt oxide films on gold substrate at 475° C. via AACVD within the scope of the invention in a low resolution top plan view (left), a high resolution top plan view (middle), and a cross-sectional view (right) for a deposition time of 10 minutes.
Figure 3C:
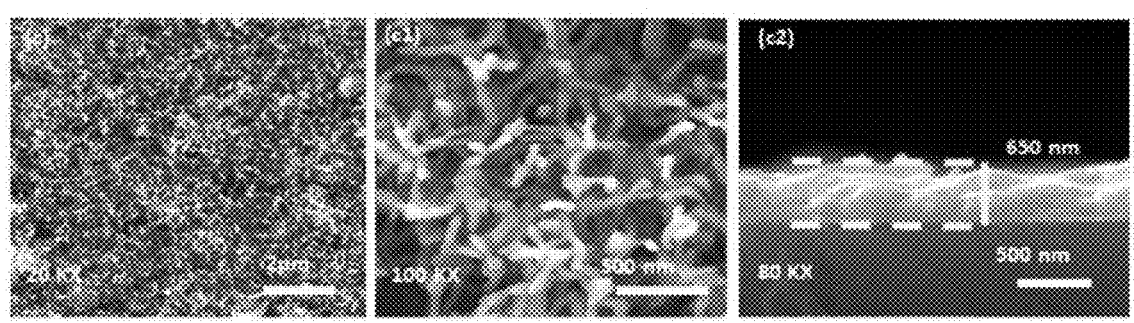
FIG. 3C shows SEM images of deposited cobalt oxide films on gold substrate at 475° C. via AACVD within the scope of the invention in a low resolution top plan view (left), a high resolution top plan view (middle), and a cross-sectional view (right) for a deposition time of 15 minutes, and (d, d1, d2) 20 minutes.
Figure 3D:
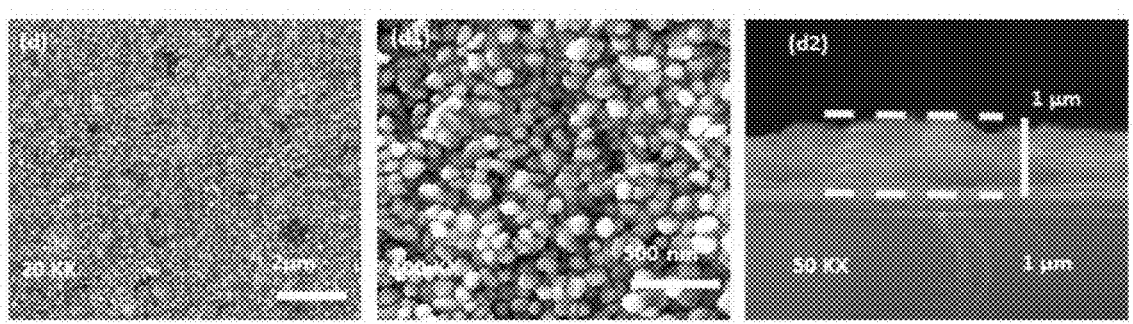
FIG. 3D shows SEM images of deposited cobalt oxide films on gold substrate at 475° C. via AACVD within the scope of the invention in a low resolution top plan view (left), a high resolution top plan view (middle), and a cross-sectional view (right) for different deposition times of 20 minutes.

CoOx-20, with the hypenated number indicating increasing deposition times, i.e., 5 min, 10 min, 15 min, and 20 min, were prepared at a constant temperature of 475° C. As a result of first 5 minutes of deposition, well-defined and well-distributed cobalt oxide nanoparticles were observed, with diameters of 50 to 100 nm, as seen in FIG. 3A, i.e., view (a) and (a1). The overall cobalt oxide film thickness at 5 minutes of deposition is ~250 nm, which is close to a monolayer nanoparticle distribution. By increasing the deposition time to 10 minutes, as seen in the top plan view SEM images in FIG. 3B and FIG. 3C, the morphology of the deposited Co layer significantly changes. The depositing nanoparticles coalesce together to take on vertically-grown, nanorod-like morphologies, as particularly evident in view (c1). This transition is indicated when moving from 10 minute (FIG. 3B) to 15 minute (FIG. 3C) deposition times. Such growth patterns have been reported by others while depositing metal or metal oxide films via AACVD. However, in the exemplary method used in the present application, the film thicknesses at 10 and 15 minutes were respectively 450 and 650 nm. The cross-sectional images of the inventive films indicated a dense layer of the cobalt oxide network. After deposition for 20 minutes, as seen in FIG. 3D, the nanoparticles return to shapes analogous to the 5-minute deposition case in FIG. 3A, though the film thickness grows to 1 µm and is more dense than at 5, 10, or 15 minutes of deposition time. However, at 20 minutes deposition, the nanoparticle size is 2 to 3 times smaller than those deposited at 5 minutes, yet their arrangement in the film is multilayered, which can be seen from FIG. 3D. All cobalt oxide layers deposited as described in the Example appear denser and smoother without significant cracking on their surfaces, except the one grown for 5 minutes time in which voids on the cobalt oxide film surface can be clearly seen. Still, the morphology from the 5-minute deposited film can be beneficial for the electrochemical OER activity because its monolayer arrangement is linked to its electrochemically active surface area.

Figure 4:
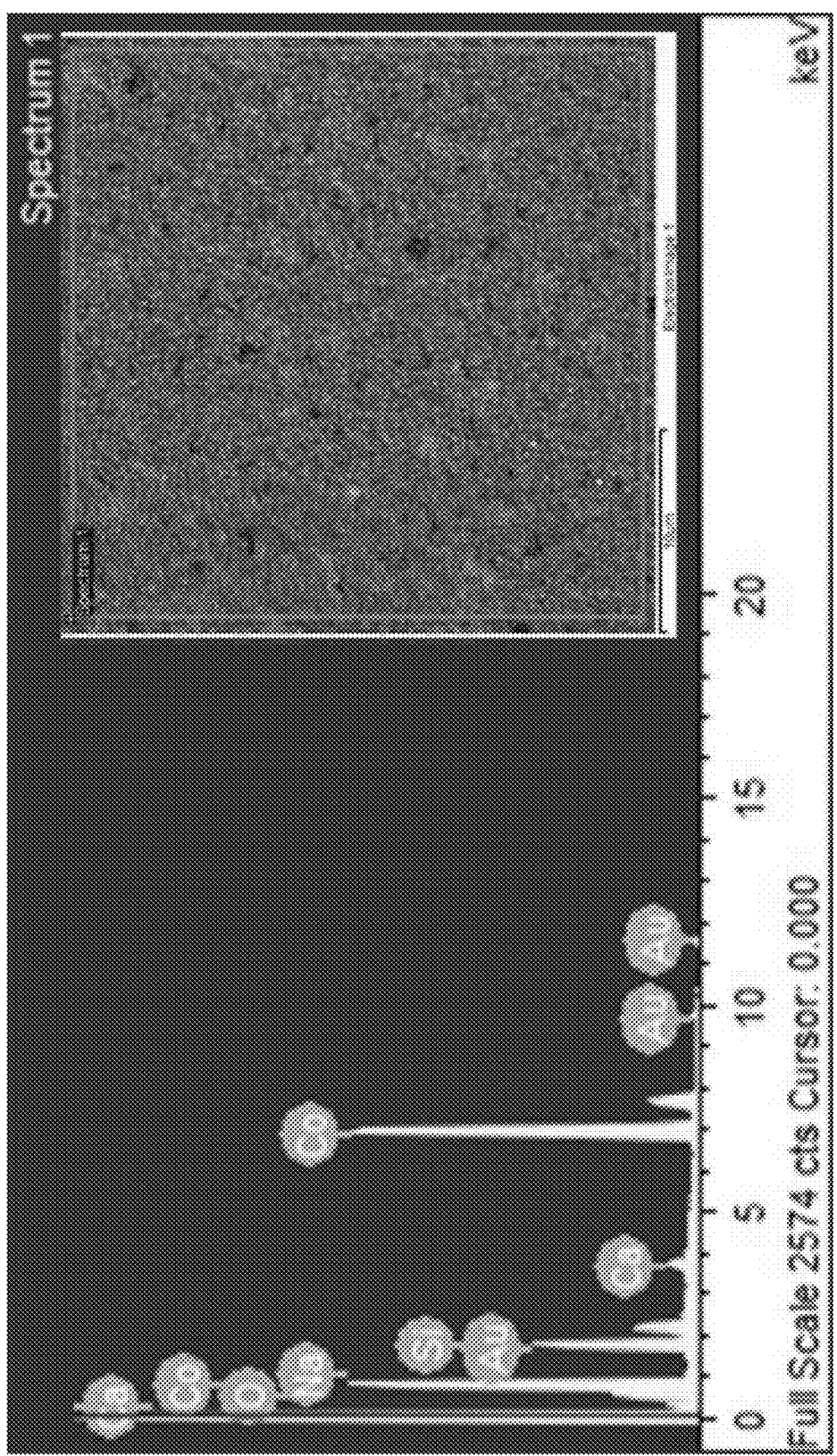
FIG. 4 shows a representative energy-dispersive x-ray (EDS, EDX, EDXS or XEDS) spectrum of cobalt oxide film deposited for 20 minutes on Au substrate at 475° C. via AACVD according to the example.

FIG. 4 shows representative results of energy-dispersive x-ray spectroscopy (EDX) analysis of only the cobalt oxide film deposited for 20 minutes, though all cobalt oxides films were analyzed to evaluate the presence of cobalt constituents in the films. The EDX spectrum in FIG. 4 confirms the formation of a homogenous cobalt oxide layer on a gold-coated substrate. Unexpectedly, no carbon impurities were found on the film due to the thermal decomposition of the Co(acac)$_3$ precursor. The lack of carbon in FIG. 4 indicates an unexpectedly thorough pyrolysis of the precursor during AACVD as described herein, without incorporation of carbonaceous matter in the films, e.g., from an initial theoretical 50.15 wt. % carbon to no more than 5, 4, 3, 2, 1, 0.5, 0.1, 0.001 wt. %, or less carbon, even if the films are deposited for longer periods of time, such as 20, 30, 40, 45, 50, or 60 minutes. This data also confirms the purity of cobalt oxide films.

Figure 5A:
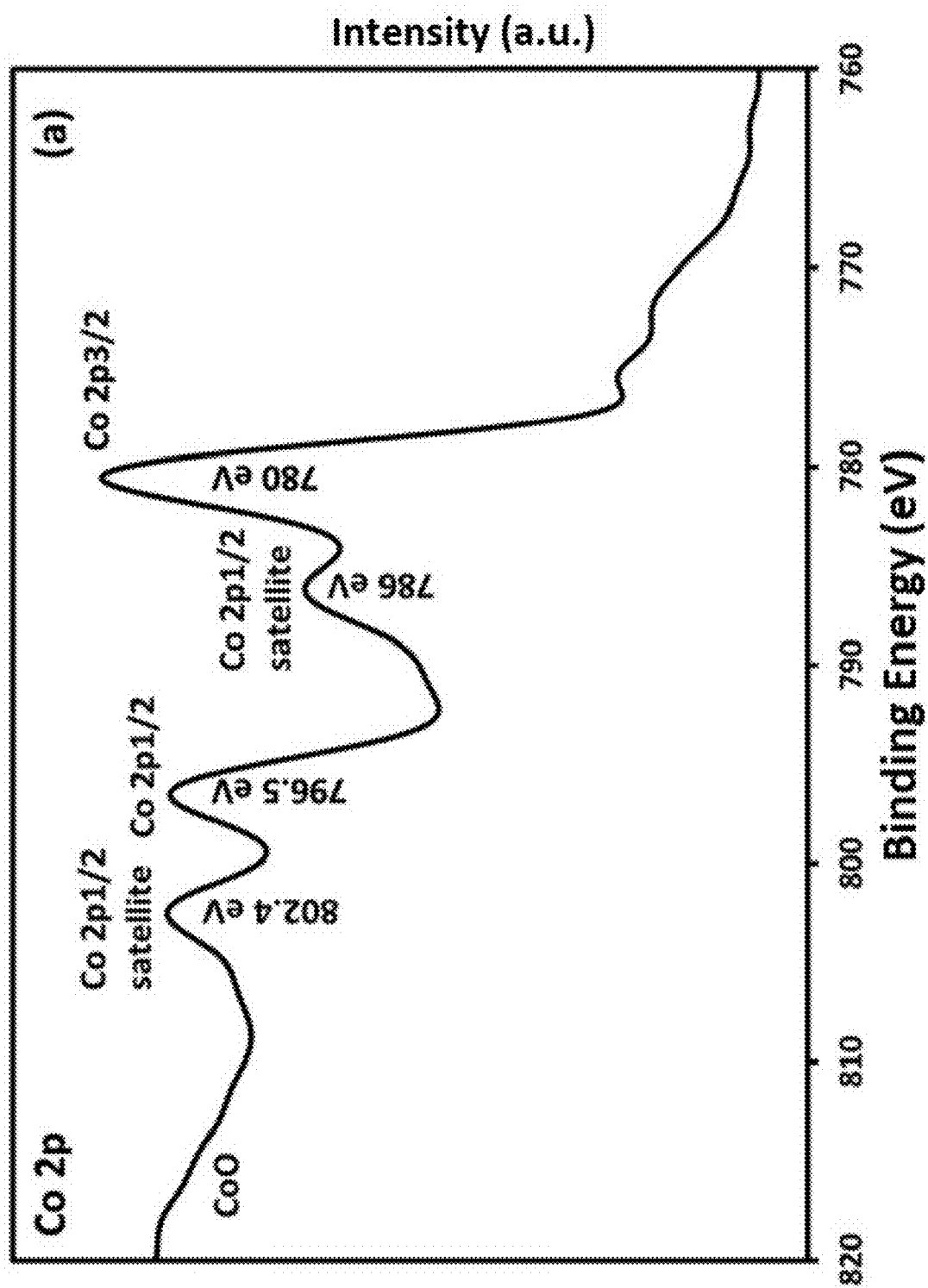
FIG. 5A shows an X-ray photoelectron (XPS) spectrum of a cobalt oxide film within the scope of the invention deposited on gold substrate for 20 min via AACVD for Co 2p.
Figure 5B:
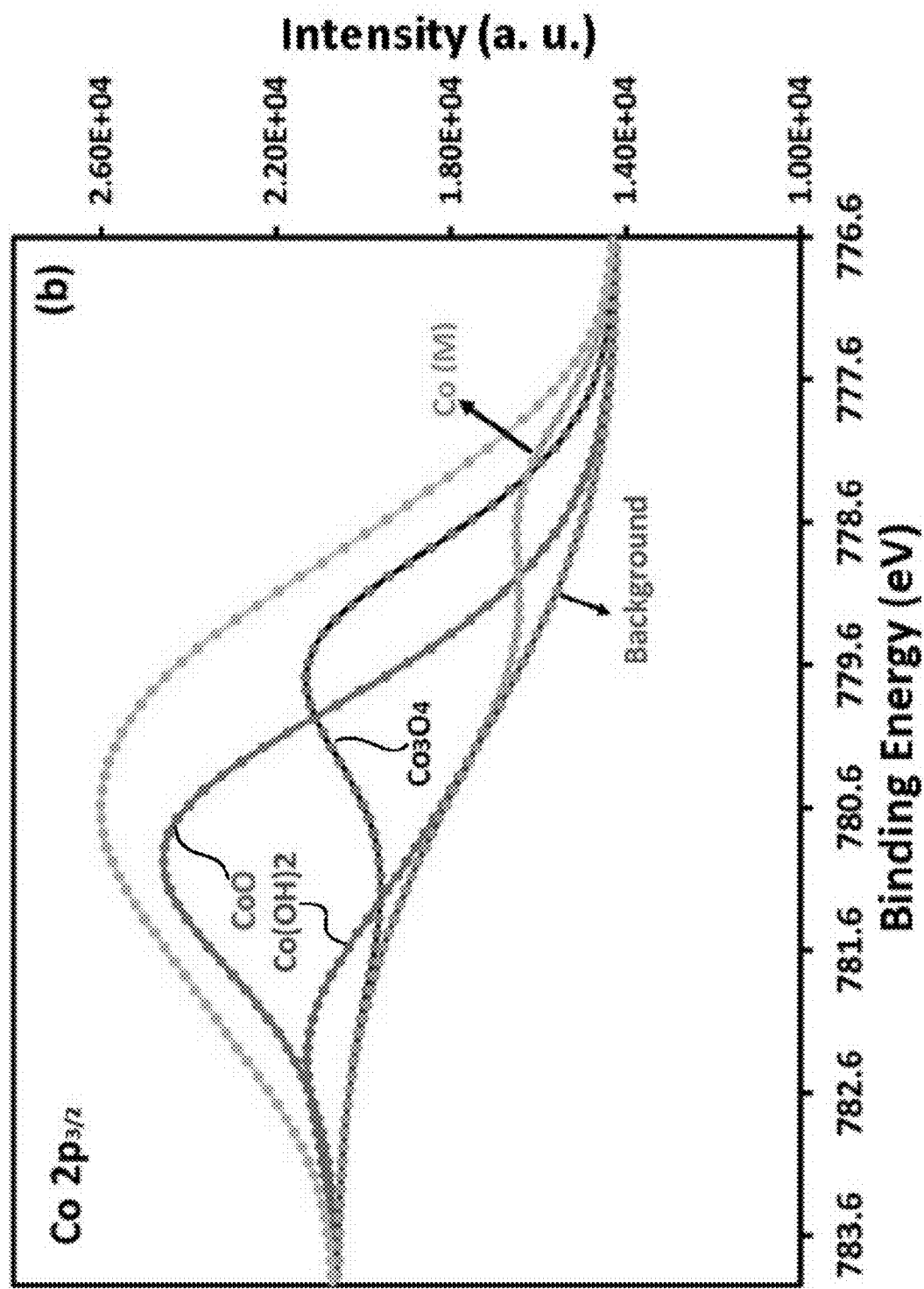
FIG. 5B shows an XPS spectrum of a cobalt oxide film within the scope of the invention deposited on gold substrate for 20 min via AACVD for deconvoluted Co $2p_{3/2}$.
Figure 5C:
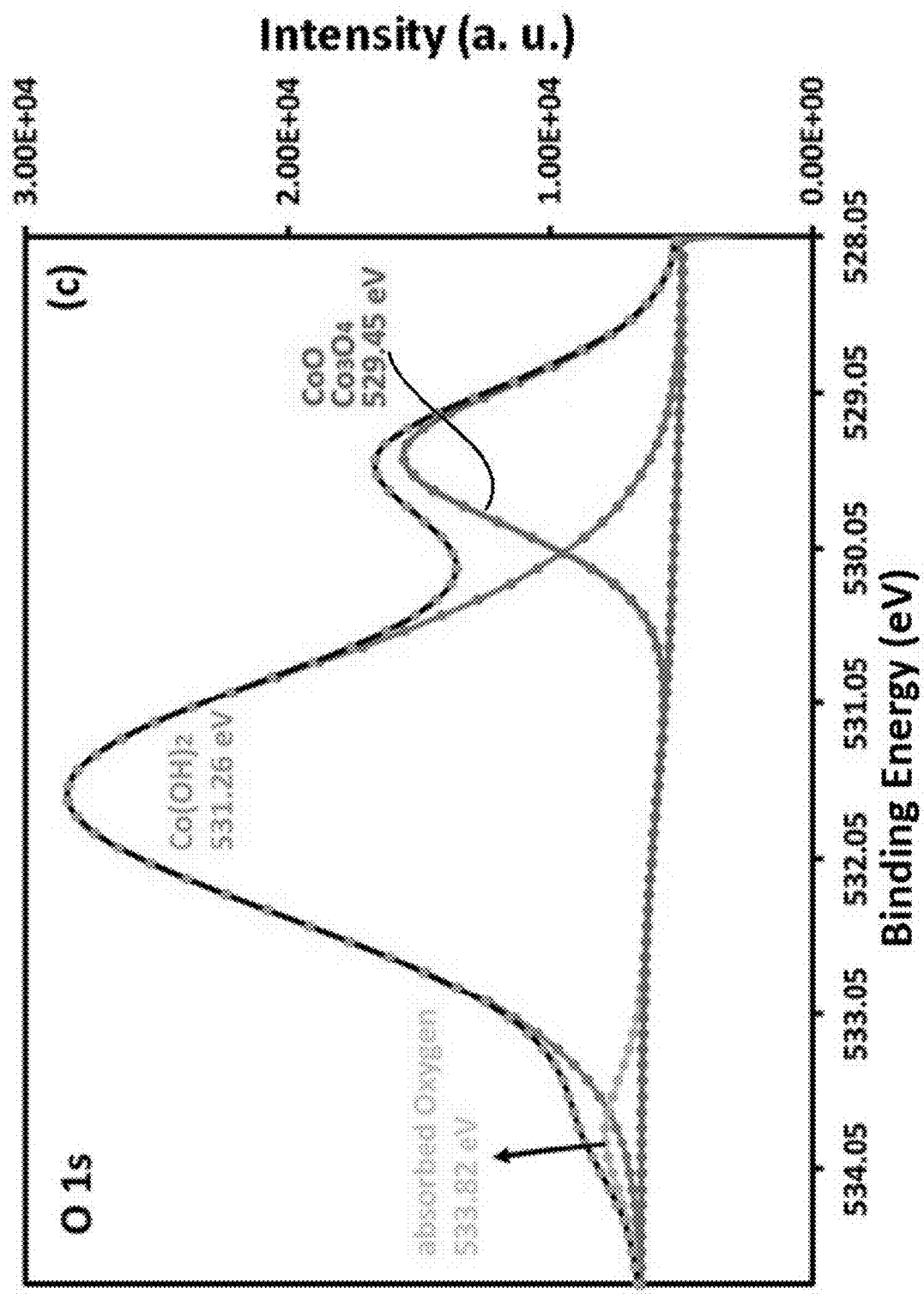
FIG. 5C shows an XPS spectrum of a cobalt oxide film within the scope of the invention deposited on gold substrate for 20 min via AACVD for deconvoluted O 1s.

FIG. 5A to 5C show x-ray photoelectron spectroscopy (XPS) results with chemical properties of the cobalt oxide film deposited for 20 minutes. In the cobalt 2p region, peaks found at 780.5 and 796.5 eV binding energies, respectively related to the $2p_{3/2}$ and $2p_{1/2}$ levels. The binding energy difference between the two components of the Co 2p was measured to be 16 eV, in agreement with literature data for CoO. The intense satellite features at binding energies of 786 eV and 802.4 eV are used as a fingerprint for the recognition of high-spin Co(II) species in CoO. This assignment is supported by inspecting the $2p_{3/2}$ peak in detail, as the $2p_{3/2}$ peak can be resolved into three peaks. The substantial, broad peak at 780.8 eV may be attributed to the predominant CoO phase, as the unpaired nature of the half-filled $E_g$ band of the $Co^{2+}$ cation results in strong electron correlation and cause substantial broadening upon photoemission. A $Co_3O_4$ phase cannot be definitively ruled out due to air exposure, and $CO_3O_4$ may be indicated by the peak at 779.6 eV. The presence of small quantities of cobalt metal may also be detected by the signal at 778.4 eV.

The results in FIG. 5A to 5C indicate that cobalt oxide films produced by AACVD are mainly CoO, with cobalt predominantly in the oxidation state (II), possibly being oxidized to a mixture of $Co^{2+}$ and $Co^{3+}$ due to air exposure. Such air oxidation would create the correspondence to the $Co_3O_4$, most likely. The XPS results in FIG. 5A to 5C are in complete agreement with the XRD in FIG. 1, wherein CoO, $Co_3O_4$, and cobalt metal were detected as crystalline phases.

The 0 is surface XPS signal, seen in FIG. 5C, for CoO could be fitted with three different components at 529.5, 531.6 and 533.8 eV, respectively. While the first peak may be attributed to the monoxide, the second and third peaks indicate a hydroxyl species and adsorbed water, respectively. Although the presence of hydroxyl groups should cause a shift of about 1 eV in the Co 2p peak binding energies, no such effect was detected. This missing shift may be due to the hydrated species is present only in the outermost layers.

Figure 6A:
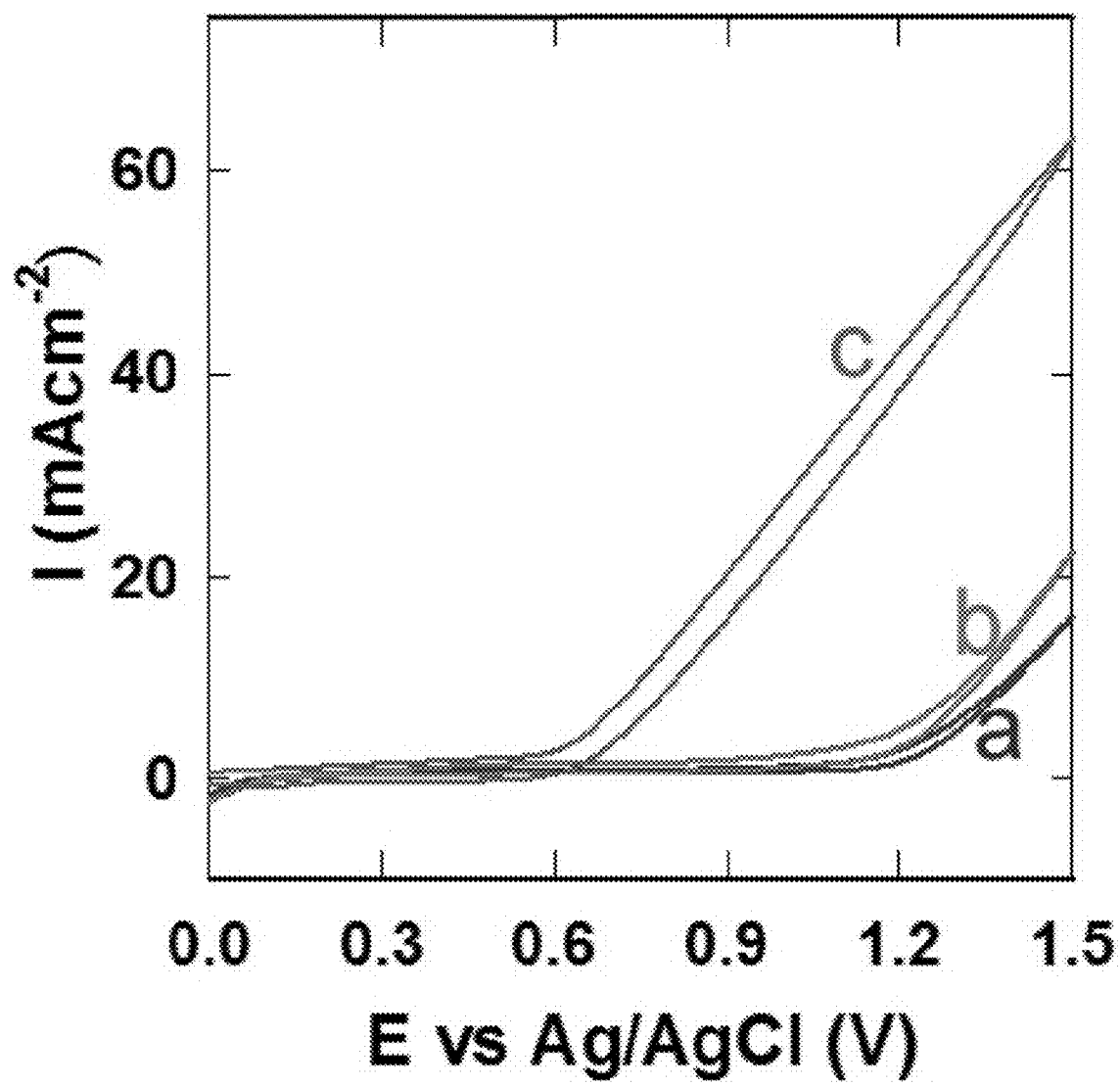
FIG. 6A shows cyclic voltammograms (CVs) recorded at scan rate of 0.1 V/s in 0.1 M NaOH electrolyte of (a) an Au substrate as prepared according to the Example, (b) an Au substrate sintered at 475° C., and (c) a cobalt oxide film deposited on an Au substrate for (c) 5 minutes.
Figure 6B:
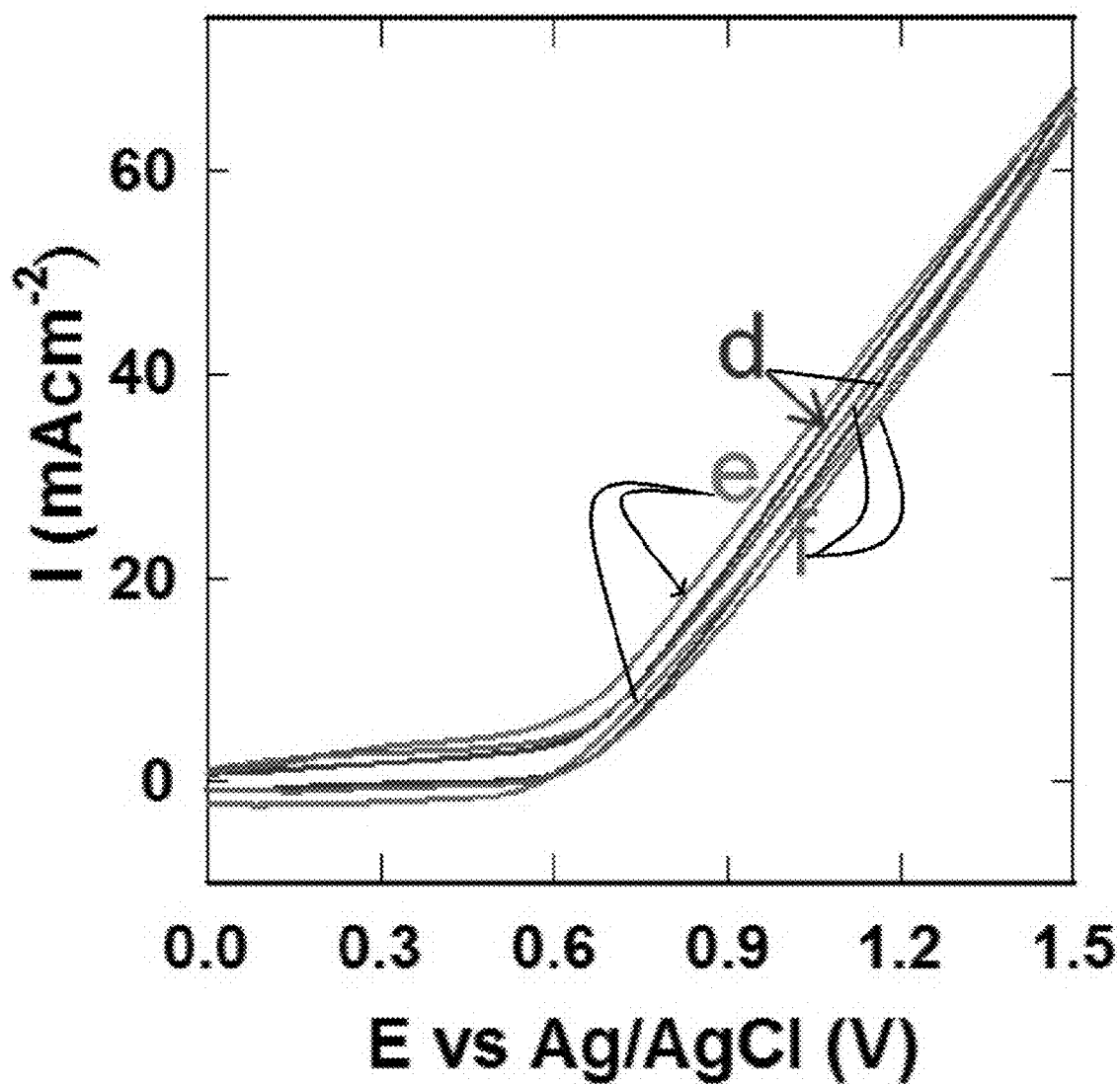
FIG. 6B shows CVs recorded at scan rate of 0.1 V/s in 0.1 M NaOH electrolyte of cobalt oxide films deposited on Au substrates for different deposition times (d) 10 minutes, (e) 15 minutes, and (f) 20 minutes.

FIGS. 6A and 6B show the OER activities of gold electrodes having cobalt oxide layers deposited over the gold via AACVD for different deposition times, i.e., 5 to 20 minutes, evaluated by a series of electrochemical measurements. FIG. 6A shows the cyclic voltammograms (CVs) of the metal evaporated gold before and after sintering at 475° C. as well as a layer of cobalt oxide grown for 5 minutes by forward biasing (E) of 0 to 1.5 V (vs Ag/AgCl) at a scan rate of 0.1 V/s. The unsintered Au electrode and its sintered analog, both show a high onset potential of ~1.25 V versus Ag/AgCl for water oxidation. However, the current density of sintered Au electrode is slightly higher than that of the unsintered gold electrode.

Sintered metal films can have their own contribution towards the catalytic reactions. Both sintered and unsintered gold electrode films showed similar results towards OER. Thus, the sintering process for gold appears to have no significant role in the overall OER performance. However, the combination the cobalt oxide film with gold layer, possibly for its role as an electron sink, provided an unexpected synergy in the OER performance. The phenomenon of slightly higher current density correlates to higher crystallinity and the porous nature of the sintered gold electrode, relative to the unsintered film. An inventive cobalt oxide electrode with a 5-minute deposition times showed a current density of 10 mA/cm$^2$ only at 0.75 V versus Ag/AgCl with an onset potential of 0.6 V versus Ag/AgCl for the water oxidation. This current density increased to 63 mA/cm$^2$ at 1.5 V versus Ag/AgCl. These observations suggest that the functionalization of gold with cobalt oxide enhances the current density while lowering the onset potential. The enhancement may be attributed to the catalytic water oxidation capability of the deposited cobalt oxide film providing efficient reaction sites. The overpotential of anodic OER ($\eta$) is calculated using Equation 1, below, at a current density of 10 mA/cm$^2$, where $E_A$ is the applied potential and 0.197 (V) is the offset potential for Ag/AgCl reference electrode.

$$\eta(V) = E_A(V) - (1.23 - 0.197 - 0.059(pH))(V) \quad \text{Eq. 1}$$

The calculation in Equation 1 reveals that the cobalt oxide catalyst prepared according to the Example exhibits a higher current density than known cobalt based catalysts and only has an overpotential of 484 mV for current density of 10 mA/cm$^2$. The determined onset overpotential for this 5-minute deposition film was 334 mV. Comparisons of these overpotentials with those of various reported cobalt materials for OER efficiency are provided in Table 1, below.

TABLE 1

Different cobalt based materials and their catalytic performance towards water oxidation reaction in basic media.

| Co - Material | Base Electrolyte Concentration | Onset Overpotential (mV) | Overpotential at 10 mA/cm$^2$ (mV) |
|---|---|---|---|
| CO$_3$O$_4$NPs | 1M | — | 534 |
| Co$_3$O$_4$—CuCo$_2$O$_4$ | 0.1M | ~320 | 498 |
| Fe—Co$_3$O$_4$ | 0.1M | ~340 | 486 |
| Ni$_x$Co$_3$—$x$O$_4$ NW | 1M | ~340 | 420 |
| Zn—Co-LDH/CNT | 0.1M | 340 | 548 |
| Zn—Co-LDH NS | 0.1M | 230 | ~480 |
| CoCo—NS | 1M | ~300 | 353 |
| NiCo—NS | 1M | ~290 | 334 |
| NiCo LDHs NS | 1M | ~300 | 367 |
| Ni—Co Hydroxide NTs | 0.1M | 310 | 460 |
| Electrodeposited Co—P film | 1M | — | 345 |
| NiCo$_2$S$_4$@rGO | 0.1M | — | 470 |
| Mn$_3$O$_4$/CoSe$_2$ nanocomposite | 0.1M | — | 450 |
| Au-supported Cobalt oxide | 0.1M | 351 | 507 |
| Cobalt oxide (AACVD) on metal evaporated Au | 0.1M | 334 | 484 |

Table 1 illustrates the efficiency of cobalt oxide films deposited according to the aspects of the invention for 5 minutes onto a gold substrate. Both the onset potential and the overpotential for 10 mA/cm$^2$ current density are either smaller or comparable in all 0.1 M basic media. This is an unexpected result, given the rapid deposition timeframe.

Aspects of the invention include methods of conducting an oxygen evolution reaction. Inventive OER methods may comprise: contacting an aqueous solution with an electrode comprising a glass layer, a gold layer, and an AACVD-deposited cobalt oxide layer, wherein the contacting generates O$_2$ from the aqueous solution. The contacting and generation of O$_2$ preferably has an onset overpotential in a range of from 320 to 340, 325 to 338, 330 to 336, or 332 to 335 mV versus Ag/AgCl for water oxidation (e.g., any of these endpoints and/or at least 300, 310, 315, 317.5, 322.5, 324, 326, 327.5, 329, 331, 332, 332.5, 333, 333.5, or 334 mV, and/or no more than 400, 375, 365, 360, 350, 345, 342.5, 341, 339, 338, 337.5, 337, 336.5, 336, 335, or 334.5 mV), and/or with an overpotential at 10 mA/cm$^2$ in a range of from 460 to 500, 470 to 495, 480 to 490, 482 to 488, or 483 to 486 mV (e.g., any of these endpoints and/or at least 450, 455, 465, 475, 477.5, 479, 481, 482.5, 483.5 mV and/or no more than 525, 515, 505, 502.5, 498, 497.5, 496, 494, 492.5, 491, 489, 487.5, 486.5, or 485 mV). The aqueous solution may be an electrolyte or salt solution, particularly a basic solution, such as an alkali metal hydroxide and/or alkaline earth metal hydroxide. For example, the aqueous solution may contain Li, Na, K, Rb, Cs, Mg, Ca, Sr, and/or Ba, with a hydroxide or similar anion(s), e.g., carbonate, bicarbonate, etc. The solution may be buffered, e.g., with phosphate, ammonium, sulfate, citrate, acetate, etc., and/or with more sophisticated organic molecules including N-cyclohexyl-2-aminoethanesulfonate, [tris-(hydroxymethyl)-methylamino]-propanesulfonate, 2-(bis(2-hydroxyethyl)-amino)-acetate, tris(hydroxymethyl)-aminomethane, 3-[N-tris-(hydroxymethyl)-methylamino]-2-hydroxypropanesulfonate, 3-[N-tris-(hydroxymethyl)-methylamino]-2-hydroxypropanesulfonate, 4-(2-hydroxyethyl)-1-piperazineethanesulfonate, 2-[[1,3-dihydroxy-2-(hydroxymethyl)propan-2-yl]amino]-ethanesulfonate, 3-(N-morpholino)-propanesulfonate, piperazine-N,N'-bis(2-ethanesulfonate), dimethylarsenate, and/or 2-(N-morpholino)-ethanesulfonate. The concentration of the aqueous solution may be in a range of from 0.001 to 2, 0.01 to 1, 0.05 to 0.5, 0.075 to 0.2 or 0.9 to 0.125 M, and/or at least 0.025, 0.0333, 0.04, 0.055, 0.06, 0.065, 0.0666, 0.07, 0.08, 0.085, 0.0875, 0.091, 0.0925, 0.095, or 0.0975 M and/or no more than 1.5, 1.25, 1.0, 0.75, 0.65, 0.55, 0.45, 0.4, 0.333, 0.3, 0.25, 0.2, 0.175, 0.15, or 0.125 M. The gold layer may have thickness of any inventive layer described herein, and may even be a monolayer. Moreover, the gold may be doped and/or replaced by inventive electron sink metal(s) and/or metalloid(s) as described herein. The cobalt oxide generally directly contacts the gold layer, e.g., on one side of the gold layer, and the opposite side of the gold layer generally directly contacts the glass or other inert substrate. At least a portion of the cobalt oxide layer is deposited by AACVD, generally grown at a rate and temperature (around 475° C., in a range of from 400 to 550, 425 to 525, 450 to 500, or 460 to 490° C.) as described herein for AACVD, such as in a range of from 0.2 to 2 nm/s and/or at least 0.3, 0.33, 0.35, 0.4, 0.45, 0.5, 0.55, 0.6, 0.65, 0.7, 0.8=725, 0.75, 0.775, 0.8, 0.825, 0.85, or 0.875 nm/s. For example, the cobalt oxide layer may have a thickness of at least 100, 150, 200, 225, 250, 275, 300, 325, 350, 375, 400, 425, 450, 475, or 500 nm and/or no more than 1500, 1250, 1000, 750, 500, 475, 450, 425, or 400 nm.

Aspects of the invention include electrodes, having layers as described herein, e.g., comprising: a glass (or other inert) layer; a gold (or mixed or alternative material electron sink) layer having a thickness, e.g., of 25 to 100 nm, or any other thickness as described herein; and an AACVD-deposited cobalt oxide layer having a thickness in a range of from 100 to 1500 nm, or any other thickness as described herein. The electrodes may have an onset overpotential in a range of from 320 to 340 mV (or any other inventive range discussed above) and/or an overpotential at 10 mA/cm$^2$ in a range of from 460 to 500 mV. Inventive electrodes may have any or all of the spectroscopy features disclosed in the drawings.

Inventive electrodes may have electrochemically active surface areas (ECSA) in a range of from 75 to 750, 95 to 650, 110 to 600, 200 to 500, 300 to 475, or 400 to 450 cm$^2$ for a coating on a 2 cm$^2$ substrate, e.g., at least 97.5, 115, 125, 150, 175, 210, 250, 275, 325, 350, 375, 390, 410, 425, 435 cm2 for a coating on a 2 cm$^2$, and/or no more than 625, 575, 550, 525, 510, 505, 495, 490, 485, 475, 465, 450, 445, 440, or 435 cm2 for a coating on a 2 cm$^2$. A first form of the cobalt oxide layer, when viewed under SEM, may have 40 to 80, 50 to 70, or 55 to 65% agglomerated (or partially merged-melded) spheroids with average diameters in a range of 50 to 300, 750 to 250, or 100 to 200 nm. A second form of the cobalt oxide layer, when viewed under SEM, may have 70 to 100, 80 to 100, or 85 to 99% agglomerated (or partially merged-melded) spheroids with average diameters in a range of 50 to 200, 75 to 150, or 100 to 125 nm. A second form of the cobalt oxide layer, when viewed under SEM, may have coral-like non-linear rods with average diameters in a range of 25 to 100, 30 to 90, or 35 to 80 nm and/or average lengths in a range of from 100 to 750, 250 to 650, or 350 to 500 nm. A fourth form of the cobalt oxide layer, when viewed under SEM, may have at least 65, 65, or 85% agglomerated, but distinct (unmerged) spheroids with average diameters in a range of 25 to 150, 35 to 125, or 45 to 100 nm. The catalyst electrodes may include more than one of any of these layer forms and/or mixtures of the forms.

FIGS. 6A and 6B show a study of time dependent deposition and its influence on the film microstructure and catalytic efficiency. A CV representation of cobalt oxide electrodes deposited for different durations by AACVD is shown in FIG. 6B, wherein the onset potential sinks for 10 and 15-minute depositions but increases slightly again for 20-minute deposition. The current densities are higher for higher metal deposition corresponding to greater metal loadings, yet these effects are not significant to attract attention. The active layer with sufficient reaction centers linked to the base electron sink is already deposited after 5 minutes of AACVD.

To connect the catalytic film performance to the growth patterns shown in SEM, the electrochemically active surface area (ECSA) of all the films must be studied. The ECSA is calculated from the electrochemical double layer capacitances of the films which were obtained from the CVs in a static aqueous solution of 0.1 M NaOH at scan rates of 0.01, 0.03, 0.05, 0.07, and 0.09 V/s in a potential range of 0.1 to 0.2 V.

Figure 7A:
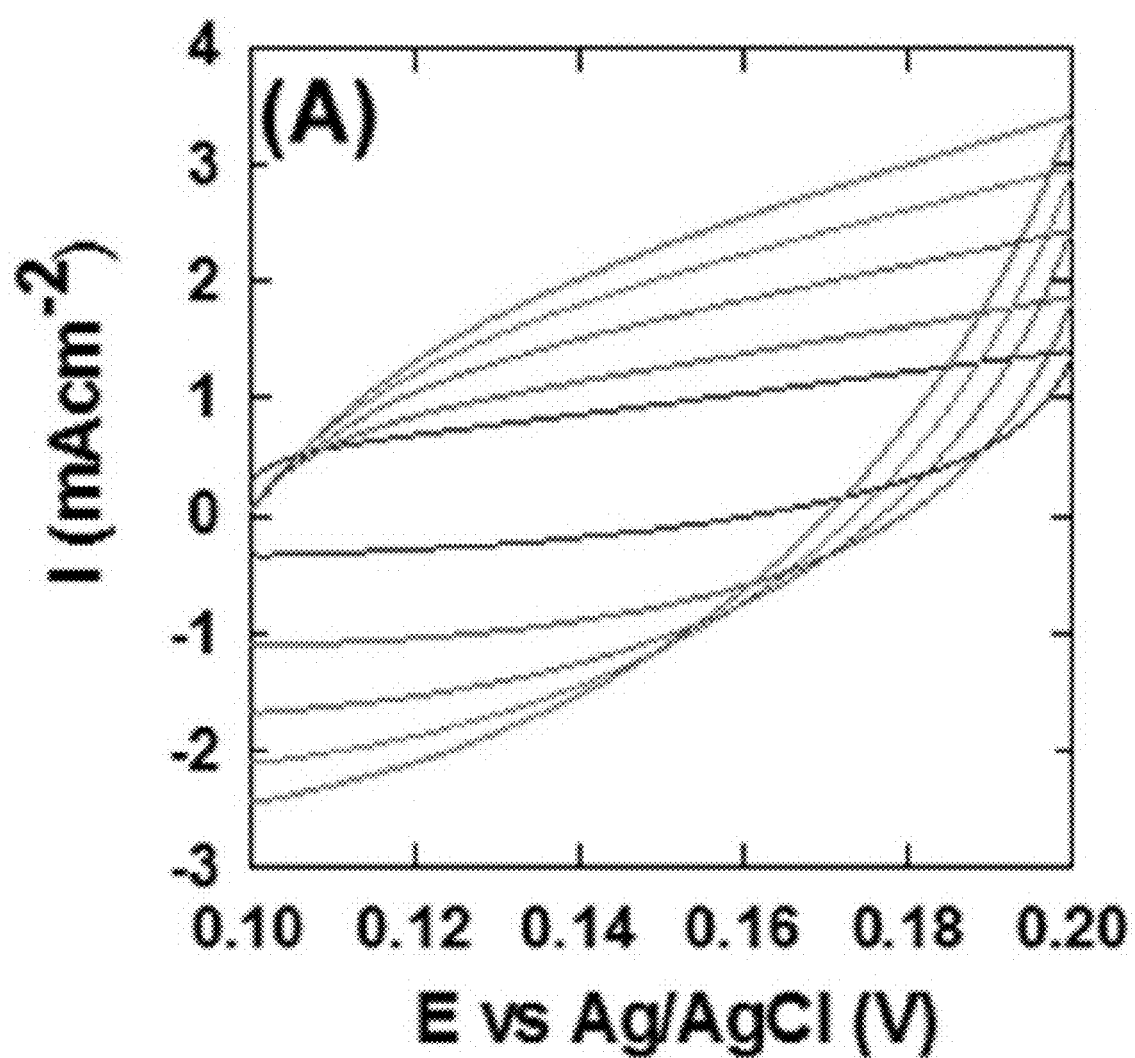
FIG. 7A shows CVs in a static aqueous solution of 0.1 M NaOH solution at scan rate of 0.01, 0.03, 0.05, 0.07 and 0.09 V/s in a potential range of 0.1 to 0.2 V for an inventive cobalt oxide film deposited at 475° C. on a gold substrate for 15 minutes via AACVD.

FIG. 7A shows cyclic voltammetry measurements for 15-minute deposition. All current measured in this non-Faradic potential region was due to the double layer charging current ($I_c$). The plot of $I_c$ versus the scan rate yielded a straight line with a slope equal to double layer capacitance ($C_{dl}$) from which the ECSA can be obtained by dividing the $C_{dl}$ with area-specific capacitance of the sample ($C_s$). ECSA can be a significant term for the catalytic activity, but it is generally known that the catalytic activity is related to both the intrinsic effects of the material itself as well as surface area effects of the deposited film. Thus, ECSA calculations assist in describing whether the intrinsic catalytic activity of a material is more important than its surface area. Because electrodes in such electrokinetic measurements often have small geometric areas, direct application of BET for surface area measurement can lead to errors.

Figure 7B:
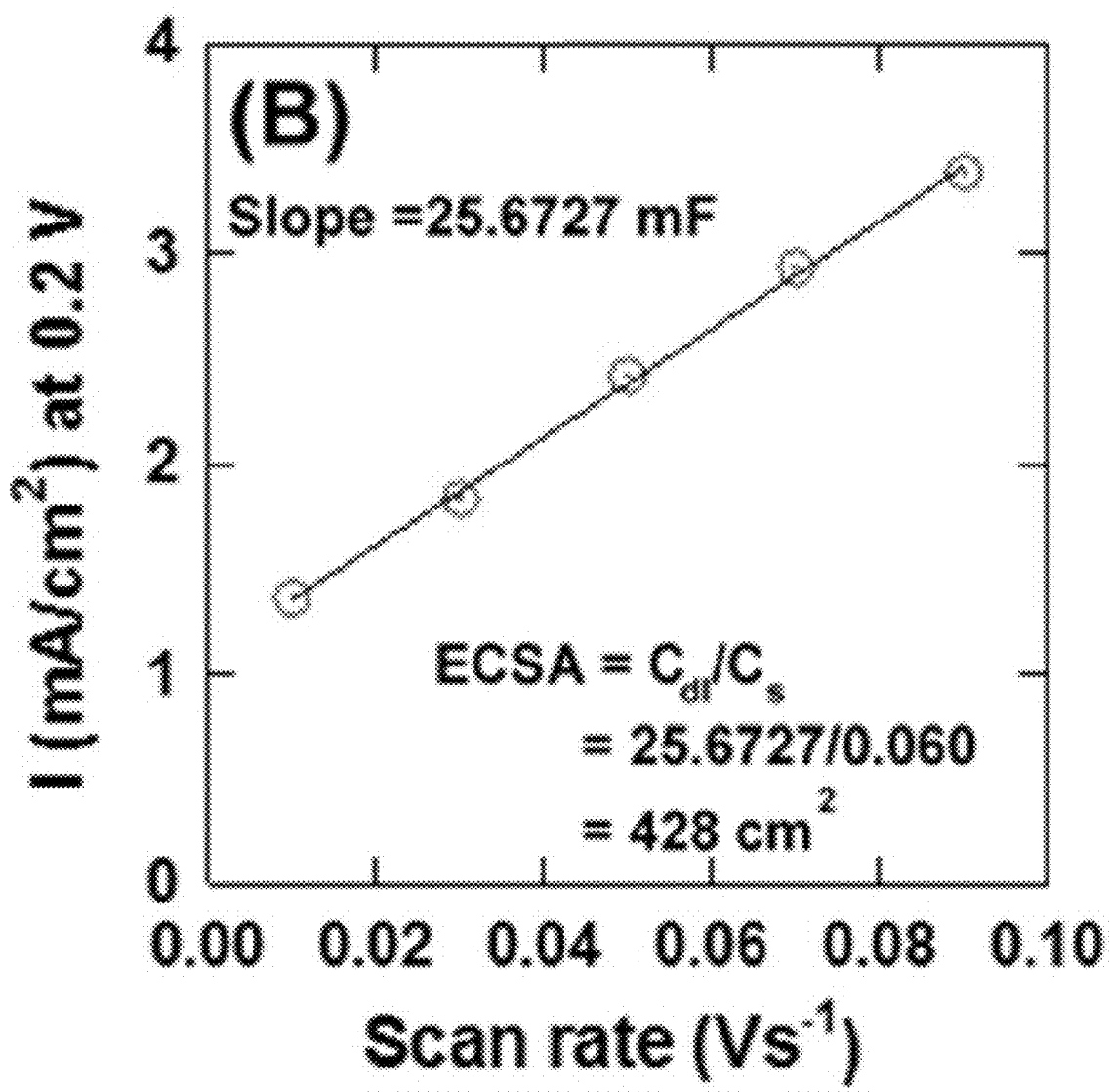
FIG. 7B shows a calculation of electrochemical surface area (ECSA) for the same film by double layer capacitance.

As shown in FIG. 7B, the calculated ECSA for a 15-minute film deposition is ~428 cm$^2$. Similar calculations for the 5, 10, and 20-minute depositions resulted into the ECSAs of 210 cm$^2$, 115 cm$^2$, and 99 cm$^2$ respectively. These surface areas correctly correlate to SEM data indicating a 15-minute deposition to yield a highly integrated network of nanorods with a high surface area, while a 5-minute deposition generates a monolayer of dispersed nanoparticles, thus having about ½ the surface area of the 15-minute deposit. However, regarding electrocatalytic performance, 5-minute deposition generated almost the same amount of anodic current as a 15-minute deposition, though the 15-minute deposit surface area of later is double. This anodic current may be attributed to a synergy of between the deposition layer and substrate, including an electrocatalytic film connected to an electron sink in the form of metal evaporated gold. Once a monolayer is generated by a 5-minute deposition and the deposit is linked to the electron sink, it is believed that the highest efficiency of the inventive materials can be achieved. It is theorized, without wishing to be bound, that although the surface areas may change after the changes in the morphology and the thickness of the films upon increasing the deposition times, the catalytic performance generally remains the same because typically a single monolayer is connected to the base electron sink, e.g., gold layer. Thus a rapid protocol can be established with, compared to electrochemical deposition, CVD, or other known processes, high OER efficiency with only 5 minutes of deposition time, or even 4, 3, or 2 minutes.

Figure 8:
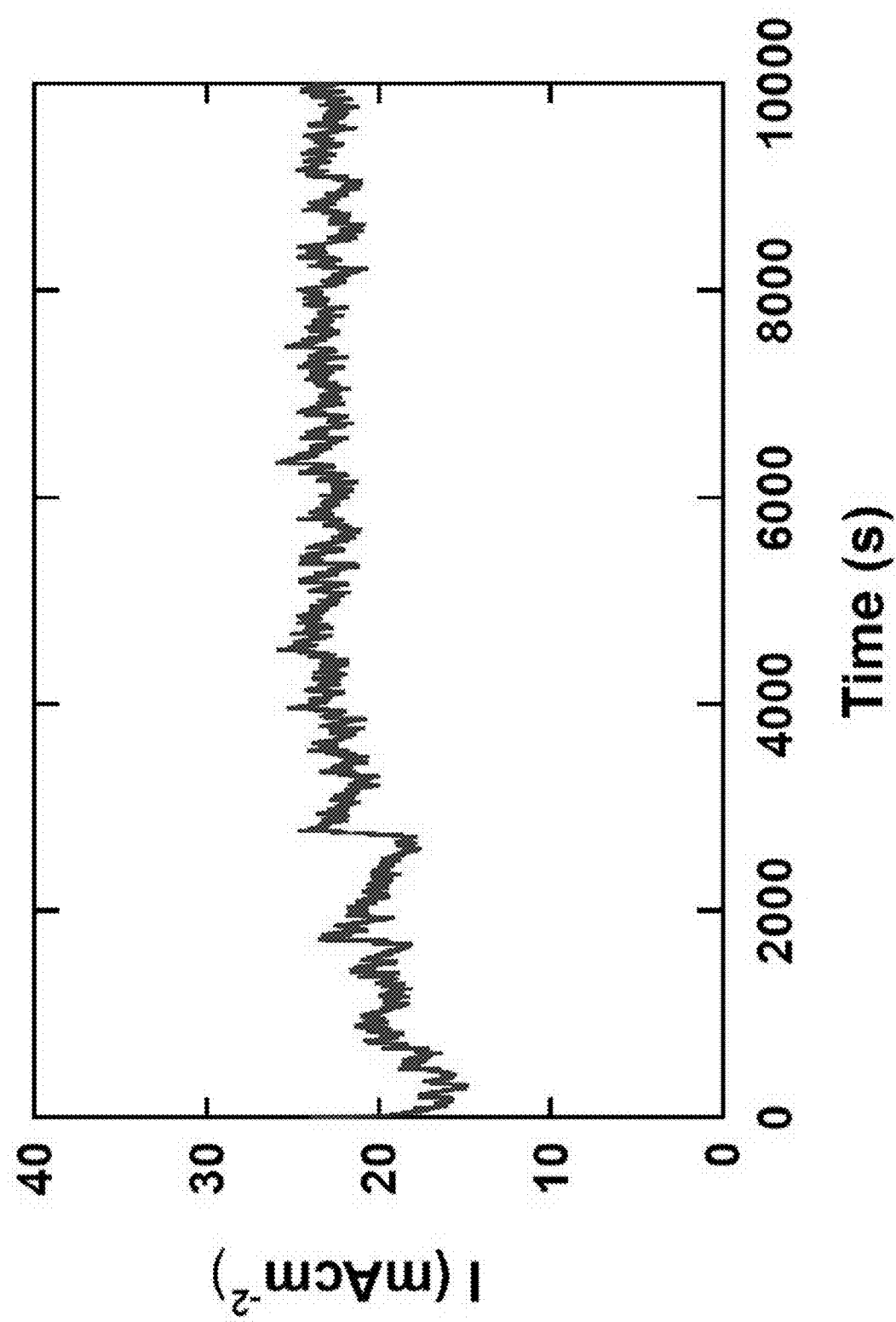
FIG. 8 shows amperometric responses of an inventive cobalt oxide deposited on a gold-coated substrate prepared by 15 min deposition at 0.9 V over 10,000 seconds in an aqueous solution of 0.1 M NaOH.

FIG. 8 shows amperometric responses of inventive cobalt oxide on gold-coated substrates, prepared by 15 minutes of deposition at 0.9 V over 10,000 seconds in aqueous solution of 0.1 M NaOH. With films prepared in line with the present disclosure, the growth rate measured can be in the range of ~0.8 nm/s, which is 10 times higher than an earlier reported electrochemically deposited film's growth rate. With such a high rate of film growth, the stability of the deposit is usually a concern and various film-protective strategies have been implemented in the art for long term use of the structures. To assess the overall stability of the films grown according to the invention in terms of long term performance, an electrode with 15 minutes of cobalt solution deposition time is polarized at 0.9 V for a period of up to 10,000 seconds, i.e., 2.78 hours, with a constant overall current density around 20 mA/cm$^2$. As seen in FIG. 8, for inventive layered structures, the overall change in the performance of the film is negligible even with the bare films without any protective layer. Some small fluctuations, as seen in noisy line in FIG. 8, are unavoidable because of the evolving oxygen bubbles from the surface of the layered structures.

Figure 9:
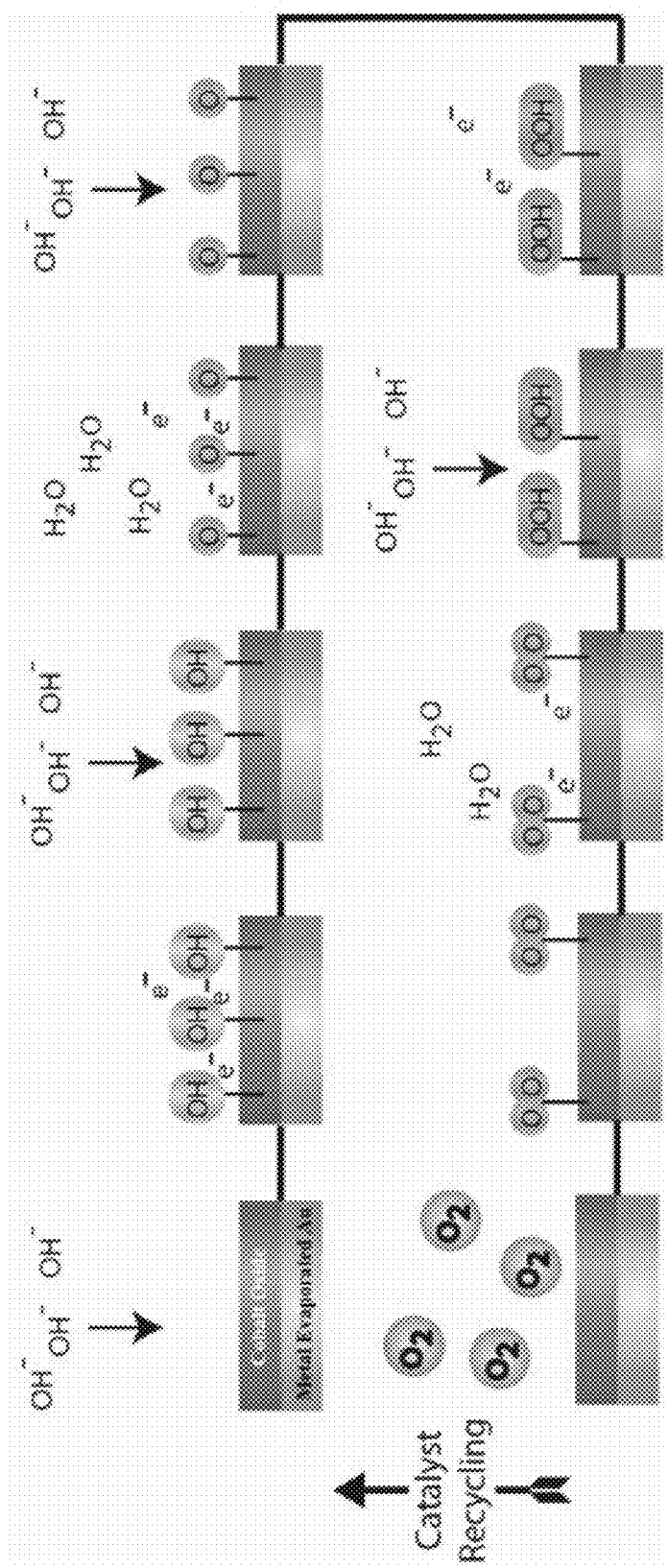
FIG. 9 shows a schematic of the proposed mechanism for electrocatalytic oxygen evolution reaction (OER) using cobalt oxide films deposited on metal evaporated gold.

FIG. 9 shows a schematic of a proposed mechanism for electrocatalytic OER using inventive cobalt oxide films deposited on metal evaporated gold, presenting a plausible mechanism based on the results obtained here, supported by quantum chemical understanding of cobalt materials indicating that the increased oxidative activity of different cobalt species is facilitated by underlying gold atoms. The deposited layers can be in the form of inactive cobalt species, e.g., CoO(OH), as well as active cobalt species, e.g., Co (IV). Gold's electron capture ability is believed to lead to the formation/facilitation of Co (IV) species thereby increasing the surface concentration of Co (IV) species, while the potential is increased.

Thus, the reaction may begin in the alkaline media with the adsorption and discharge of hydroxyl anions to form adsorbed hydroxyl groups. Further hydroxyl anions under the increasing potential may react with adsorbed hydroxyl groups to form water leaving only the oxygen atoms adsorbed to the catalytic film. The reaction continues with the hydroxyl anions further reacting with adsorbed oxygen to generate OOH groups at the surface which in the next step again generate water to leave oxygen molecules adsorbed on the surface. Each of these four steps generates one electron (per step), totaling to a four electron process. In the final step, the adsorbed oxygen leave the surface to complete the oxygen evolution reaction. The rate limiting step in the whole process is thought to be the formation of OOH species, which is postulated to be facilitated by Co (IV). The Co (IV) species are thought to improve the electrophilic behavior of the adsorbed oxygen atoms facilitating the nucleophilic attack of reacting hydroxyl anions to form OOH. The Co (IV) species are also believed to promote the fourth step by deprotonating the OOH groups to generate oxygen using the oxygen atom's electron withdrawing inductive effect.

It is believed that the deposited cobalt film should to be linked to an electronegative element, such as gold, to support and/or maintain a higher concentration of Co (IV) species in the top layer. In the present application the electronegative element is provided in the form of pure evaporated gold that by itself is nanostructured to give a coherence to the resulting film electrodes. Beyond this, the whole deposition process using AACVD as proposed herein is simple, low cost, and fast for batch production and utilization at industrial scale.

Numerous modifications and variations of the present invention are possible in light of the above teachings. It is therefore to be understood that within the scope of the appended claims, the invention may be practiced otherwise than as specifically described herein.

The invention claimed is:

1. A method of manufacturing a multilayered catalyst structure, the method comprising:
    coating a glass substrate through evaporation and deposition of Au with a layer comprising an Au nanostructure;
    heating the Au nanostructure coated glass substrate at a temperature of from 475° C. to no greater than 600° C. in a reactor to obtain a sintered Au nanostructure coating; and
    introducing an aerosol of a cobalt solution comprising a cobalt complex and a solvent with a carrier comprising an inert gas to the reactor for a time of 5 minutes to form a monolayer of nanoparticles of cobalt oxide comprising CoO as the main cobalt component directly on the layer comprising the sintered Au nanostructure to obtain a multilayered catalyst structure having an interface between the layer comprising the sintered Au nanostructure and the layer of nanoparticles of cobalt oxide;
    wherein
    the cobalt oxide nanoparticles have a diameter of from 50 to 100 nm, and
    the layer comprising the Au nanostructure is not electrochemically roughened prior to the formation of the layer of cobalt oxide nanoparticles.

2. The method of claim 1, wherein the layer comprising the sintered Au nanostructure comprises at least 95 wt. %, relative to the total coating weight, of Au.

3. The method of claim 1, wherein the layer comprising the sintered Au nanostructure has a thickness in the range of 30 to 70 nm.

4. The method of claim 1, wherein the coating of the glass substrate with the Au is carried out using a metal evaporator coater.

5. The method of claim 1, wherein the cobalt solution comprises cobalt(III) acetylacetonate, cobalt(II) acetylacetonate, cobalt(II) carbonate, cobalt(II) acetate, cobalt naphthenate, cobalt(II) phthalocyanine, cobalt(II) 2-ethylhexanoate, dicarbonyl-cyclopentadienyl cobalt(I), cobalt(II) oxalate, cobalt(II) oxo pivalate, cobalt(II ethyl/butyl phosphonate, cobalt(II) nitrate, tris(ethylenediamine)cobalt(III) chloride, dichloro-bis(ethylenediamine) cobalt(III) halide, monocobalt edetate, bis(cyclopentadienyl) cobalt(II), protoporphyrin IX cobalt, dichloro-bis-(triphenylphosphine) cobalt(II), chloro-tris(triphenylphosphine) cobalt(I), diiodo-bis(diphenylphosphino)ethane) cobalt(II), or a mixture of these.

6. The method of claim 1, wherein the cobalt complex is a cobalt (III) complex.

7. The method of claim 1, wherein the cobalt complex is cobalt (III) acetylacetonate.

8. The method of claim 1, wherein the solvent for the cobalt solution comprises pyridine, N,N-dimethylformamide (DMF), N,N-dimethylacetamide, N-methyl pyrrolidone (NMP), hexamethylphosphoramide (HMPA), dimethyl sulfoxide (DMSO), acetonitrile, tetrahydrofuran (THF), 1,4-dioxane, dichloromethane, chloroform, carbon tetrachloride, dichloroethane, acetone, ethyl acetate, pet ether, pentane, hexane(s), decalin, THF, dioxane, benzene, toluene, xylene (s), o-dichlorobenzene, diethyl ether, methyl t-butyl ether, methanol, ethanol, ethylene glycol, isopropanol, propanol, n-butanol, or a mixture of these.

9. The method of claim 1, wherein the solvent for the cobalt solution is methanol, ethanol, propanol, or isopropanol.

10. The method of claim 1, wherein the cobalt complex and the solvent in the cobalt solution are present in a weight ratio in a range of from 1:2 to 1:1000.

11. The method of claim 1, wherein the inert gas is $N_2$ and/or Ar.

12. The method of claim 1, wherein, during the introducing of the aerosol, the carrier flows at a rate in a range of from 0.1 to 10 mL/s.

13. The method of claim 1, wherein the layer of nanoparticles of cobalt oxide has a thickness in a range of from 100 to 400 nm.

14. The method of claim 1, further comprising:
    cooling the multilayered catalyst structure to a temperature between 10 and 45° C. under an inert gas over a period in a range of from 0.5 to 5 hours.

* * * * *